United States Patent
Nachumovsky

[19]

[11] Patent Number: 6,157,570
[45] Date of Patent: Dec. 5, 2000

[54] PROGRAM/ERASE ENDURANCE OF EEPROM MEMORY CELLS

[75] Inventor: Ishai Nachumovsky, Zichron Yaakov, Israel

[73] Assignee: Tower Semiconductor Ltd., Migdal Haemek, Israel

[21] Appl. No.: 09/243,973

[22] Filed: Feb. 4, 1999

[51] Int. Cl.$^7$ .................................................... G11C 16/04
[52] U.S. Cl. ........................... 365/185.18; 365/185.03; 365/185.29
[58] Field of Search ...................... 365/185.18, 185.29, 365/185.03

[56] References Cited

U.S. PATENT DOCUMENTS

| | | | |
|---|---|---|---|
| 5,412,601 | 5/1995 | Sawada et al. | 365/185 |
| 5,434,825 | 7/1995 | Harari | 365/185 |
| 5,768,192 | 6/1998 | Eitan . | |
| 5,966,332 | 10/1999 | Takano | 365/185.29 |
| 6,001,725 | 1/2000 | Eitan | 365/185.23 |

*Primary Examiner*—Richard Elms
*Assistant Examiner*—Tuan T. Nguyen
*Attorney, Agent, or Firm*—Bever, Hoffman & Harms, LLP; Edward S. Mao

[57] ABSTRACT

A circuit and method increases the endurance of memory cells in a memory array by decreasing the number of times a memory cell is programmed or erased. A bit-wise program/erase controller coupled to the memory array modifies the erasing and programming of multi-bit data words by erasing only those memory cells which must be erased and programming only those memory cells which must be programmed. Specifically, the bit-wise program/erase controller compares a new data word, which will be written into the memory array at a write address, with the current data word at the write address. The memory cells at the write address are categorized into a first subset and a second subset. The first subset of memory cells are currently in a programmed state but must be erased because the corresponding bit of the new data word is at an erased logic level. The second subset of memory cells are currently in an erased state but must be programmed because the corresponding bit of the new data word is at a programmed logic level. Bit-wise program/erase controller erases only the first subset of memory cells and programs only the second subset of memory cells. Thus, over multiple writes into the memory array, the number times each memory cell is erased or programmed is reduced resulting in greater endurance of the memory cells.

25 Claims, 13 Drawing Sheets

PROGRAM/ERASE ENDURANCE OF EEPROM MEMORY CELLS

FIELD OF THE INVENTION

The present invention relates to non-volatile memory cells. More specifically, the present invention relates to a method and structure to increase the endurance of memory cells by reducing the number of times memory cells are erased and programmed.

RELATED ART

FIG. 1 is a cross sectional view of a conventional 1-bit non-volatile semiconductor memory cell 10 that utilizes asymmetrical charge trapping. 1-bit memory cell 10, which is fabricated in p-type substrate 12, includes n+ source region 14, n+ drain region 16, channel region 17, silicon oxide layer 18, silicon nitride layer 20, silicon oxide layer 22, and control gate 24. Oxide layer 18, nitride layer 20 and oxide layer 22 are collectively referred to as ONO layer 21. Memory cell 10 operates as follows. A programming operation is performed by connecting source region 14 to ground, connecting drain region 16 to a programming voltage of about 9 Volts, and connecting control gate 24 to a voltage of about 10 Volts. As a result, electrons are accelerated from source region 14 to drain region 16. Near drain region 16, some electrons gain sufficient energy to pass through oxide layer 18 and be trapped in nitride layer 20 in accordance with a phenomenon known as hot electron injection. Because nitride layer 20 non-conductive, the injected charge remains localized within charge trapping region 26 in nitride layer 20.

Memory cell 10 is read by applying 0 Volts to the drain region 16, 2 Volts to the source region 14, and 3 volts to the gate electrode. If charge is stored in charge trapping region 26 (i.e., memory cell 10 is programmed), then memory cell does not conduct current under these conditions. If there is no charge stored in charge trapping region 26 (i.e., memory cell 10 is erased), then memory cell 10 conducts current under these conditions. The current, or lack of current, is sensed by a sense amplifier to determine the state of memory cell 10.

Note that the polarity of the voltage applied across source region 14 and drain region 16 is reversed during the program and read operations. That is, memory cell 10 is programmed in one direction (with source region 14 grounded), and read the opposite direction (with drain region 16 grounded). As a result, the read operation is referred to as a reverse read operation. Memory cell 10 is described in more detail in U.S. Pat. No. 5,768,192.

Memory cell 10 can also be controlled to operate as a 2-bit non-volatile semiconductor memory cell. To accomplish this, memory cell 10 is controlled to use a second charge trapping region in nitride layer 20, which is located adjacent to source region 14. FIG. 2 illustrates both the first charge trapping region 26 (described above in connection with FIG. 1), and the second charge trapping region 28 in dashed lines. The second charge trapping region 28 is used to store a charge representative of a second bit. The second charge trapping region 28 is programmed and read in a manner similar to the first charge trapping region 26. More specifically, the second charge trapping region 28 is programmed and read by exchanging the source and drain voltages described above for programming and reading the first charge trapping region 26. Thus, the second charge trapping region 28 is programmed by applying 0 Volts to drain region 16, applying 9 Volts to source region 14 and applying 10 Volts to control gate 24. Similarly, the second charge trapping region 28 is read by applying 0 Volts to source region 14, 2 Volts to drain region 16, and 3 Volts to control gate 24.

Note that because nitride layer 20 is non-conductive, the charges stored in the first and second charge trapping regions 26 and 28 remain localized within nitride layer 20. Also note that the state of the first charge trapping region 26 does not interfere with the reading of the charge stored in the second charge trapping region 28 (and vice versa). Thus, if the first charge trapping region 26 is programmed (i.e., stores charge) and the second charge trapping region 28 is not programmed (i.e., does not store charge), then a reverse read of the first charge trapping region will not result in significant current flow. However, a reverse read of the second bit will result in significant current flow because the high voltage applied to drain region 16 will result in unperturbed electronic transfer in the pinch off region adjacent to first charge trapping region 26. Thus, the information stored in the first and second charge trapping regions 26 and 28 is read properly.

Similarly, if both the first and second charge trapping regions are programmed, a read operation in either direction will result in no significant current flow. Finally, if neither the first charge trapping region 26 nor the second charge trapping region 28 is programmed, then read operations in both directions will result in significant current flow.

Because the 1-bit and 2-bit implementations of memory cell 10 are relatively new, the manner of using this memory cell 10 in a memory cell array has not yet been fully developed. It would therefore be desirable to have a memory array structure that allows memory cell 10 to be implemented as an electrically erasable programmable read only memory (EEPROM). For purposes of this disclosure, an EEPROM array is defined as a non-volatile memory array that can be erased on a word-by-word basis. This is in contrast to a flash memory array, which is defined as a non-volatile memory array that cannot be erased on a word-by-word basis, but which must be erased in blocks. It would further be desirable if the EEPROM array architectures could be fabricated using a standard flash process.

SUMMARY

Accordingly, the present invention provides structures and methods for implementing an EEPROM array using 2-bit non-volatile memory cells. As described above, each memory cell has a first charge trapping region for storing a first bit and a second charge trapping region for storing a second bit. In one embodiment, the EEPROM array includes an array of 2-bit memory cells arranged in a plurality of rows and columns. Each row of memory cells shares a word line, which provides a common connection to the control gates of the memory cells in the row. Also within each row, the first charge trapping region of each memory cell is coupled to the second charge trapping region of an adjacent memory cell by a diffusion bit line. Note that for purposes of the present disclosure, a charge trapping region is defined as being "coupled" to its nearest diffusion bit line, even though there is no physical connection between the diffusion bitline and the charge trapping region. In this embodiment, each diffusion bit line provides connections to memory cells in a plurality of rows.

In one embodiment, an erase operation is performed by applying a voltage of about 0 Volts to the word line of the selected memory cell, and a voltage of about 8 Volts to the diffusion bit line of the selected memory cell. Other voltages can be used in other embodiments. Because adjacent memory cells share the same word line and the same diffusion bit line, erasing the first charge trapping region of a memory cell will incidentally erase the second charge trapping region of the adjacent memory cell. Moreover, memory cells in other rows that are coupled to the same diffusion bit line will also receive the erase voltage of 8 Volts, potentially subjecting these memory cells to erase conditions.

The present invention compensates for the above-described erase conditions as follows. A storage device is coupled to the diffusion bit lines of the array. A memory control circuit is coupled to control the EEPROM array and the storage device. Prior to erasing the first charge trapping region of a first memory cell, the memory control circuit reads a plurality of bits from the array, and causes these bits to be written to the storage device. The bits read from the array are selected to include all bits that will be incidentally erased when the first charge trapping region is erased (e.g., the bit stored in the second charge trapping region of the memory cell adjacent to the first memory cell and the other bits sharing the same diffusion bit line). After these bits are stored in the storage device, the memory control circuit causes the first charge trapping region to be erased. After the erase operation is completed, the memory control circuit causes all of the bits in the storage device to be restored to the array. The net effect of these operations is to erase only the first charge trapping region of the first transistor. Because the array can be erased on a word-by-word basis in this manner, the array advantageously operates as an EEPROM array.

In another embodiment of the present invention, each row of memory cells is accessed through a dedicated set of select transistors, and the memory cells in each row have dedicated diffusion bit lines. That is, the diffusion bit lines do not extend to a plurality of rows. As a result, erasing the first charge trapping region of a first transistor only results in the incidental erasing of the second charge trapping region of an adjacent second transistor. Thus, in one variation of this embodiment, the bit stored in the second charge trapping region is written to the storage device, the first charge trapping region is erased, and the bit from the second charge trapping region is restored from the memory storage device to the second charge trapping region of the adjacent second transistor. Again, because this array can be erased on a word-by-word basis, this array advantageously operates as an EEPROM array.

In another variation of this embodiment, the second charge trapping region of the adjacent second transistor is simply not used to store data. As a result, an erase operation only erases one meaningful bit (i.e., the bit stored in the first charge trapping region of the first transistor). Because this array can be erased on a word-by-word basis, this array advantageously operates as an EEPROM array.

In another embodiment of the present invention, the number of times that a memory cell in the memory array is programmed or erased is minimized to increase the endurance of the memory cell. Specifically, when a new data word will be written into the memory array at a write address, a bit-wise program/erase controller compares the new data word with a current data word from the memory array at the write address. In response to the comparison, the bit-wise program/erase controller generates a program bit signal and an erase bit signal for each memory cell at the write address. If a bit of the current data word must be erased to create the corresponding bit of the new data word, then an associated erase bit signal is driven to the active logic level (typically, logic high). Conversely, if a bit of the current data word must be programmed to create the corresponding bit of the new data word than an associated program bit signal is driven to the active logic level (typically, logic high). If the erase bit signal of a memory cell is at an active logic level, the memory cell is categorized into a first subset of memory cells to be erased. If the program bit signal of a memory cell is at an active logic level, the memory cell is categorized into a second subset of memory cells to be programmed. Rather than erasing and programming every memory cell at the write address, only the first subset of memory cells is erased and only the second subset of memory cells is programmed. Because each memory cell is programmed or erased only when necessary, the endurance of the memory cells of the memory array is advantageously maximized.

The present invention will be more fully understood in view of the following description and drawings.

DETAILED DESCRIPTION

Figure 1:
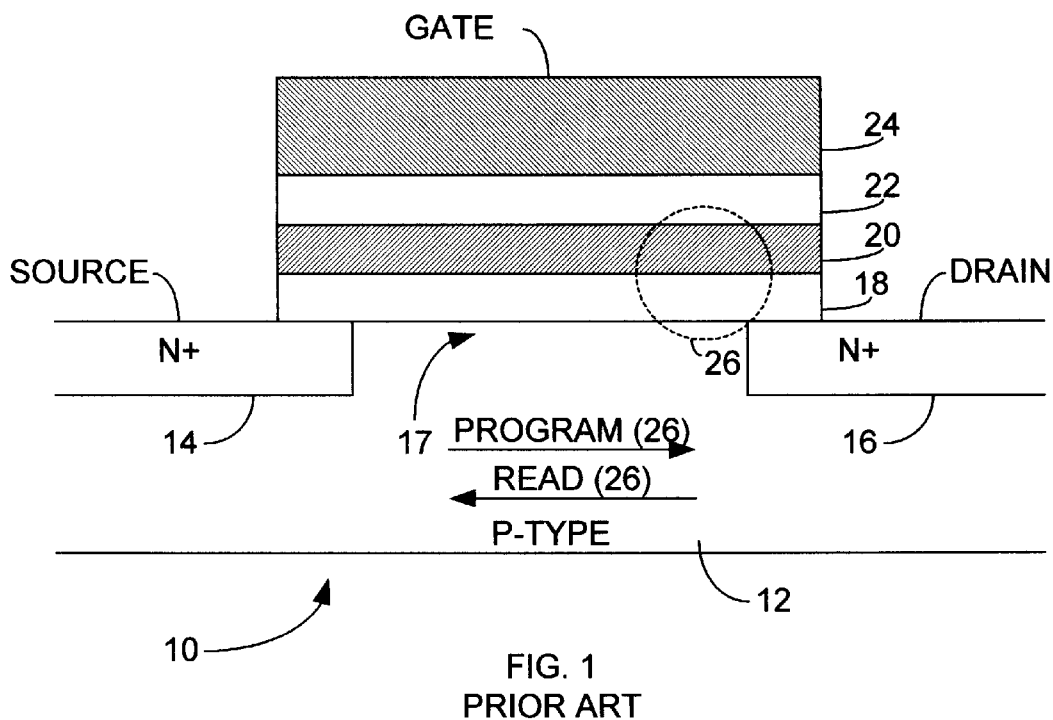
FIG. 1 is a cross sectional diagram illustrating a conventional 1-bit non-volatile memory cell.
Figure 2:
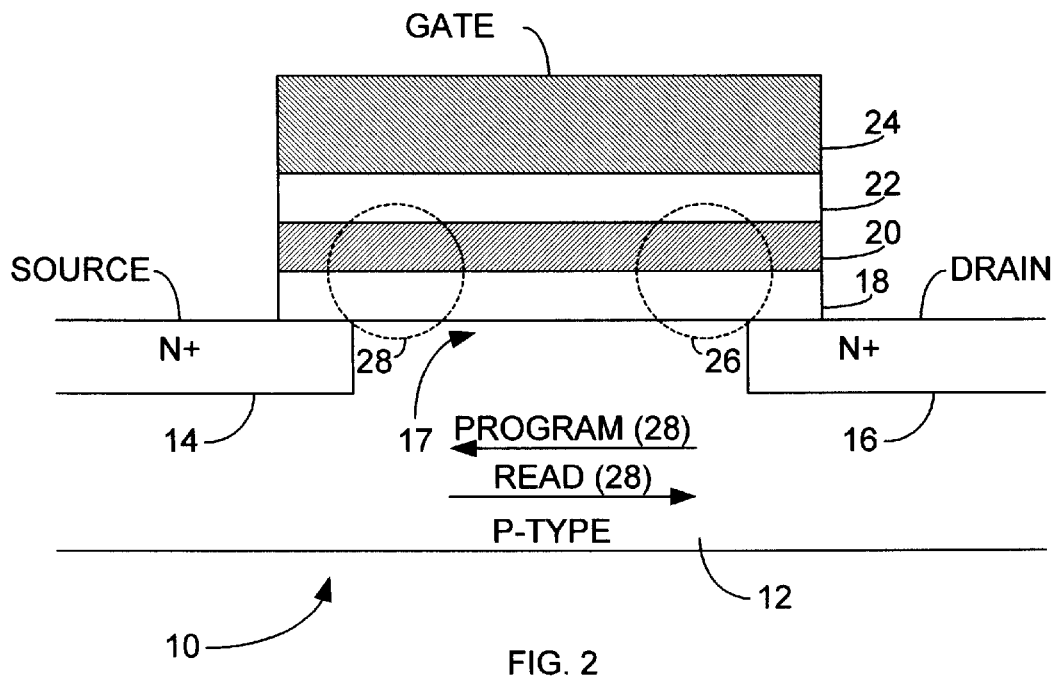
FIG. 2 is a cross sectional diagram illustrating a conventional 2-bit non-volatile memory cell.
Figure 3:
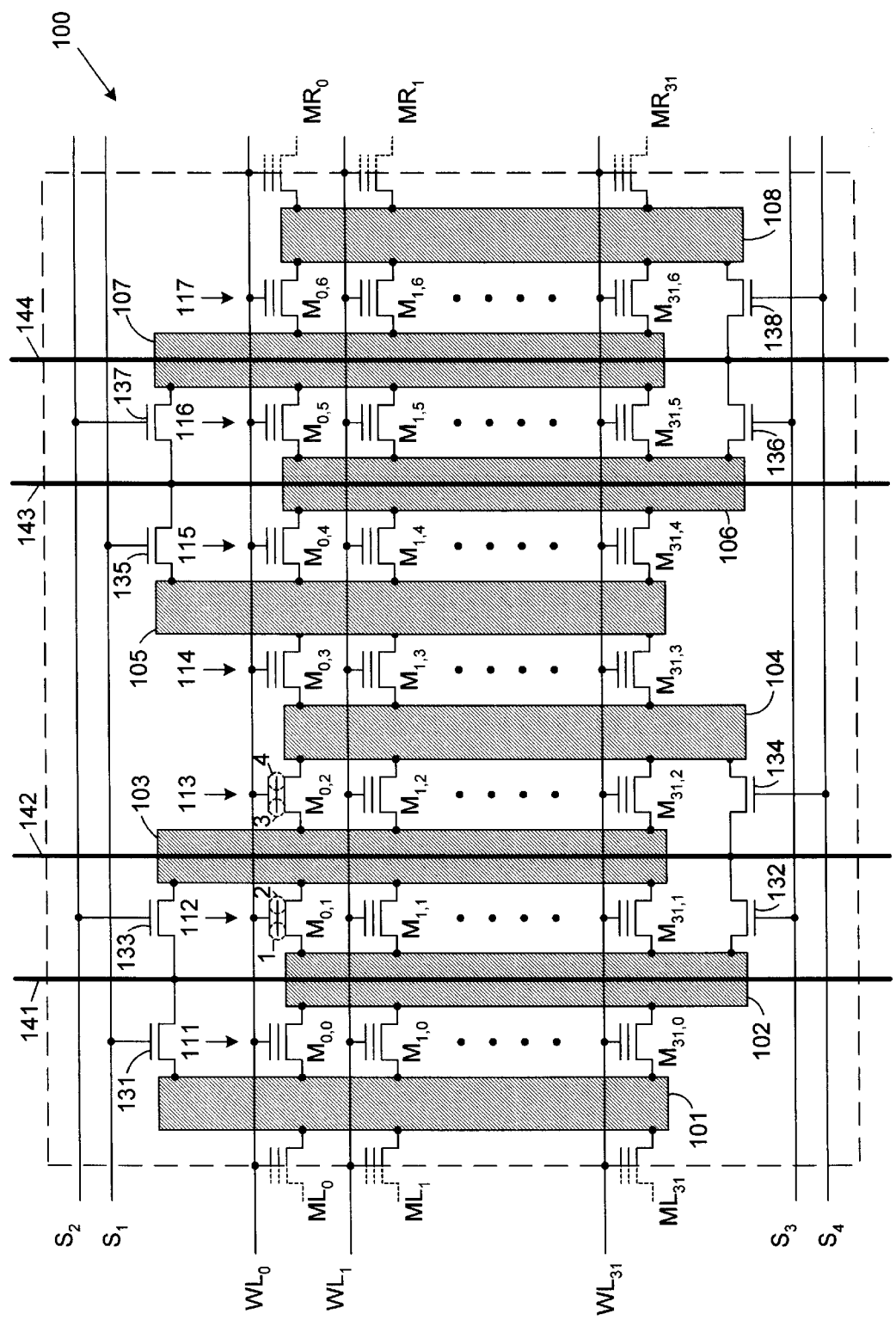
FIG. 3 is a schematic diagram illustrating a memory block that uses the 2-bit memory cells of FIG. 2.

FIG. 3 is a schematic diagram illustrating a memory block 100 in accordance with one embodiment of the present invention. Memory block 100 uses a plurality of 2-bit memory cells identical to 2-bit memory cell 10 (FIG. 2). Memory block 100 includes seven full columns of memory cells, two columns of memory cells that are shared with adjacent memory blocks, and thirty-two rows of memory cells. The rows extend along a first axis, and the columns extend along a second axis, perpendicular to the first axis. The memory cells in the seven full columns are identified as memory cells $M_{x,y}$, where X and Y represent the row and column locations, respectively, of the memory cells within memory block 100. The shared memory cells on the left border of memory block 100 are identified as memory cells $ML_x$, and the shared memory cells on the right border of memory block 100 are identified as memory cells $MR_x$. Thus, memory block includes memory cells $M_{0,0}$–$M_{31,6}$ and shared memory cells $ML_0$–$ML_{31}$ and $MR_0$–$MR_{31}$.

Each of the memory cells includes two charge trapping regions, namely, a left charge trapping region and a right charge trapping region. The charge trapping regions of memory cell $M_{0,1}$ are labeled as left charge trapping region 1 and right charge trapping region 2. Similarly, the charge trapping regions of memory cell $M_{0,2}$ are labeled as left charge trapping region 3 and right charge trapping region 4.

The source and drain regions of memory cells $M_{0,0}$–$M_{31,6}$ are formed by diffused regions 101–108, which extend in parallel along the second axis. As described in more detail below, diffused regions 101–108 also operate as bit lines within memory block 100. Consequently, diffused regions 101–108 are hereinafter referred to as diffusion bit lines. ONO structures 111–117 are located between adjacent diffusion bit lines 101–108. For example, ONO structure 111 is located between diffusion bit lines 101 and 102. The gates of the memory cells in each row are commonly connected to a word line. More specifically, the memory cells of rows 0–31 are connected to word lines $WL_0$–$WL_{31}$, respectively.

Figure 4A:
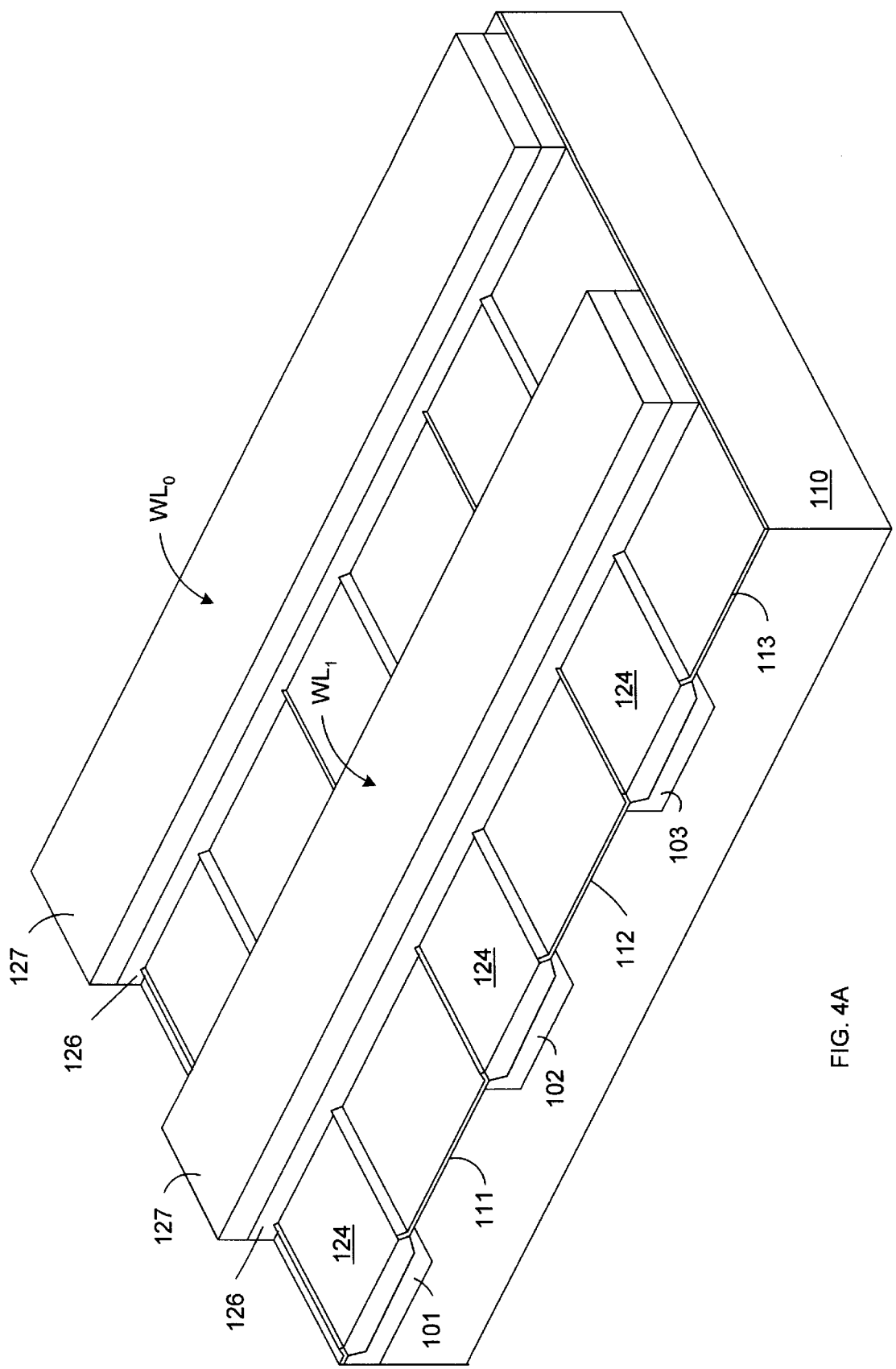
FIG. 4A is an isometric view of memory cells of the memory block of FIG. 3.
Figure 4B:
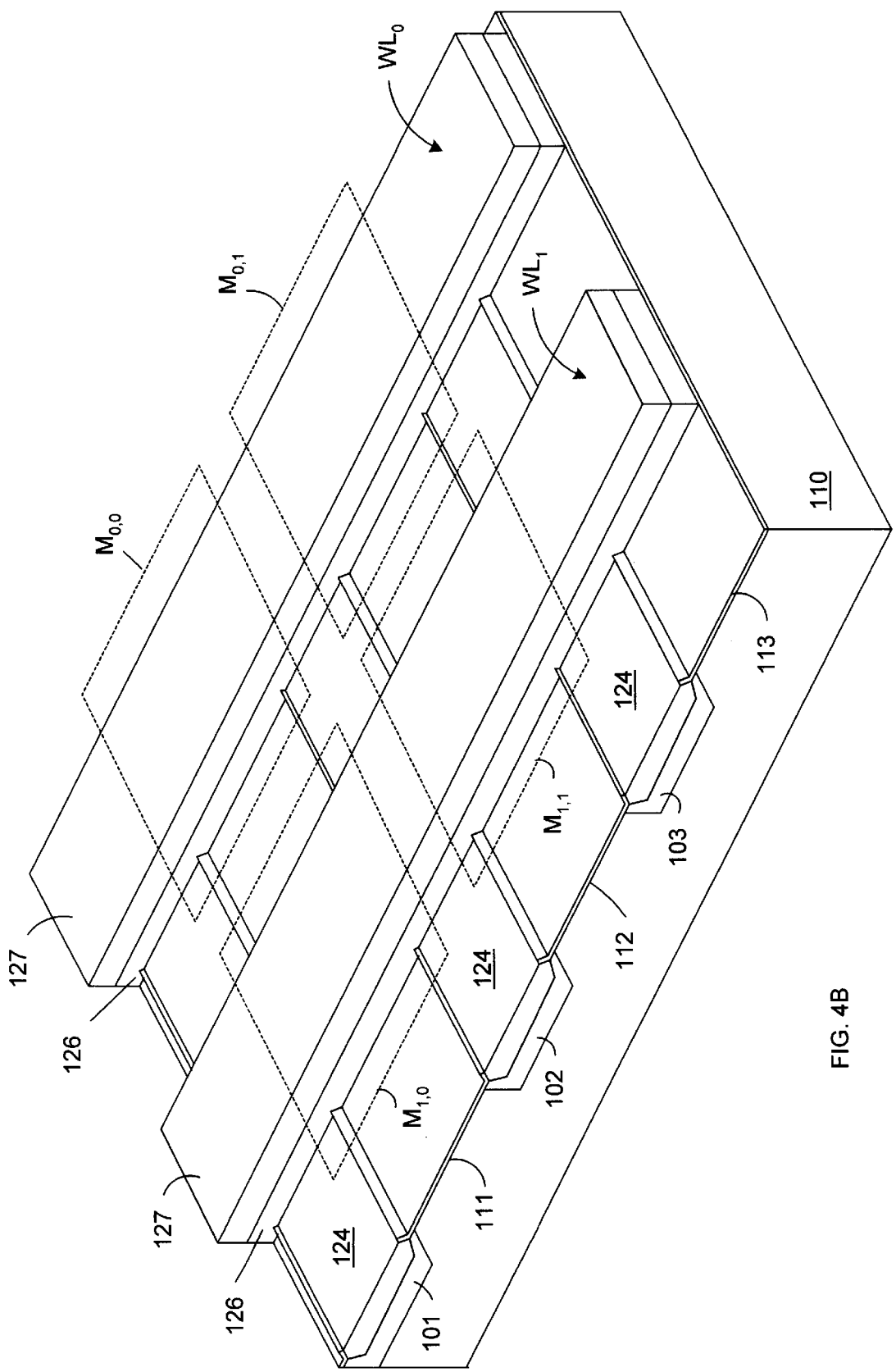
FIG. 4B illustrates the same isometric view as FIG. 4A, with the locations of the memory cells highlighted in dashed lines.
Figure 5:
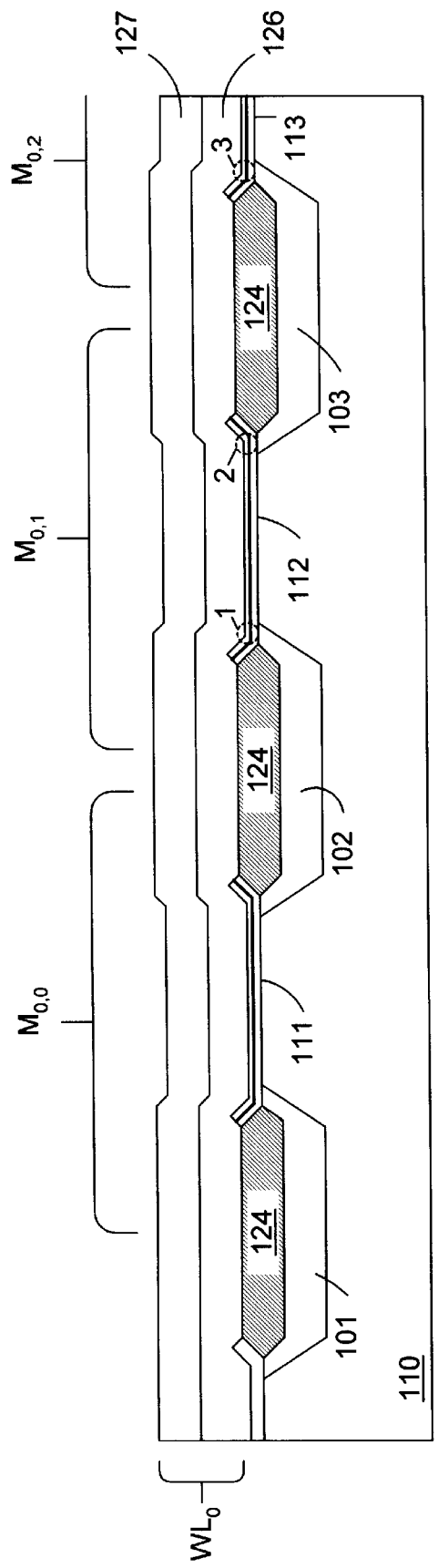
FIG. 5 is a cross sectional view of selected memory cells of FIG. 4A, taken along a word line.

FIG. 4A is an isometric view of memory cells $M_{0,0}$, $M_{0,1}$ $M_{1,0}$, and $M_{1,1}$. FIG. 4B illustrates the same isometric view as FIG. 4A, with the locations of memory cells $M_{0,0}$, $M_{0,1}$ $M_{1,0}$, and $M_{1,1}$ highlighted in dashed lines. FIG. 5 is a cross sectional view of memory cells $M_{0,0}$ and $M_{0,1}$ along the first axis through word line $WL_0$. Diffusion bit lines 101–103 are n-type regions formed in a p-type silicon semiconductor substrate 110. Diffusion bit lines 101–103 can also be formed in a p-well region. Bit line insulating regions 124 are formed over the diffusion bit lines 101–103. Bit line insulating regions 124 can be, for example, silicon oxide having a thickness of approximately 600 Å. Note that bit line insulating regions 124 are an order of magnitude thinner than conventional field oxide. Because the memory cells in memory block 100 do not require field oxide for isolation, memory block 100 can be referred to as a fieldless array. ONO structures 111 and 112 extend over bit line insulating regions 124, diffusion bit lines 101–103 and substrate 110 in the manner illustrated. Word lines $WL_0$ and $WL_1$, which are polycide or salicide structures that include a layer of conductively doped polycrystalline silicon 126 and an overlying layer of metal silicide 127, extend over ONO structures 111 and 112 (and bit line insulating regions 124). Word lines $WO_0$ and $WL_1$ form the control gates of memory cells $M_{0,0}$, $M_{0,1}$ $M_{1,0}$, and $M_1$. The above-described structures of memory block 100 are fabricated using flash processing steps. The fabrication of memory block 100 is described in more detail in commonly owned, co-filed U.S. patent application Ser. No. 09/244,312 entitled "METHODS FOR FABRICATING A SEMICONDUCTOR CHIP HAVING CMOS DEVICES AND A FIELDLESS ARRAY" by Efraim Aloni (now pending), which is hereby incorporated by reference.

Returning now to FIG. 3, the 2-bit memory cells of memory block 100 are accessed through high-voltage select transistors 131–138 and metal bit lines 141–144. Metal bit lines 141–144 are located in an interconnect layer that extends over the above-described elements of memory block 100. High-voltage select transistors 131–138 are designed to have gate oxide sufficient to withstand the high voltages required for programming and erasing the memory cells. In general, select transistors 131–138 are controlled to selectively connect metal bit lines 141–144 to diffusion bit lines 101–108. The first power terminals of select transistors 131–138 are coupled to diffusion bit lines 101–108, respectively. The second power terminals of select transistors 131 and 133 are coupled to metal bit line 141. The second power terminals of select transistors 132 and 134 are coupled to metal bit line 142. The second power terminals of select transistors 135 and 137 are coupled to metal bit line 143. The second power terminals of select transistors 136 and 138 are coupled to metal bit line 144. The gates of select transistors 131 and 135 are commonly connected to a first select line $S_1$, while the gates of select transistors 133 and 137 are commonly connected to a second select line $S_2$. Similarly, the gates of select transistors 132 and 136 are commonly connected to a third select line $S_3$, while the gates of select transistors 134 and 138 are commonly connected to a fourth select line $S_4$.

The memory cells in memory block 100 are accessed as follows. Two of the select lines $S_1$–$S_4$ are pulled high, thereby turning on the select transistors coupled to these two select lines, and two of the select lines $S_1$–$S_4$ are pulled low, thereby turning off the select transistors coupled to these two select lines. The turned on select transistors couple two columns of memory cells to the metal bit lines 141–144.

For example, when select lines $S_2$ and $S_3$ are pulled high, and select lines $S_1$ and $S_4$ are pulled low, metal bit lines 141–142 are coupled to access the second column of memory cells, and metal bit lines 143–144 are coupled to access the seventh column of memory cells. More specifically, the logic high select lines $S_2$ and $S_3$ cause select transistors 132, 133, 136 and 137 to turn on, and the logic low select lines $S_1$ and $S_4$ cause select transistors 131, 134, 135 and 138 to turn off. Consequently, diffusion bit line 102 is coupled to metal bit line 142 and diffusion bit line 103 is coupled to metal bit line 141. Similarly, diffusion bit line 106 is coupled to metal bit line 144 and diffusion bit line 107 is coupled to metal bit line 143. As a result, signals provided on metal bit lines 141 and 142 are provided to control the memory cells in the second column of memory block 100, and signals provided on metal bit lines 143 and 144 are provided to control the memory cells in the seventh column of memory block 100.

A plurality of memory blocks, identical to memory block 100 can be coupled together along the first and second axes, thereby forming a larger memory array. Shared memory cells are formed at the interfaces between memory blocks along the first axis. More specifically, the right-most shared memory cells $MR_0$–$MR_{31}$ of one memory block combine with the left-most shared memory cells $ML_0$–$ML_{31}$ of an adjacent memory block to form another column of memory cells. Stated another way, the right-most diffusion bit line of one memory block combines with the left-most diffusion bit line of an adjacent memory block (along with the ONO layer located there between) to form a shared column of memory cells. This shared column of memory cells is accessed by the right-most metal line in a memory block and the left-most metal bit line in the right-adjacent memory block. This shared column of memory cells is accessed when select lines $S_1$ and $S_4$ are pulled high and select lines $S_2$ and $S_3$ are pulled low. Note that under these conditions, access is provided to the following memory cells in memory block 100: shared memory cells $ML_0$–$ML_{31}$, shared memory cells $MR_0$–$MR_{31}$ and the fourth column of memory cells $M_{0,3}$–$M_{31,3}$. Because each column of shared memory cells counts as a half column within memory block 100, there are effectively two accessed columns within memory block 100 under these conditions.

In accordance with one embodiment of the present invention, a memory array is formed by coupling 64 memory blocks identical to memory block 100 along the first axis. This memory array can have any number of memory blocks connected along the second axis. Because each memory block has four metal bit lines, the resulting memory array has a 256 metal bit lines associated with these 64 memory blocks. In this memory array, an additional diffusion bit line, metal bit line and select transistor must be added to the left side of each of the left-most memory blocks of the array. This enables the shared memory cells $ML_0$–$ML_{31}$ of the left-most memory blocks to be accessed. Similarly, an additional diffusion bit line, metal bit line, and select transistor must be added to the right side of each of the right-most memory blocks of the array, thereby enabling the shared memory cells $MR_0$–$MR_{31}$ of the right-most memory blocks to be accessed.

Figure 6:
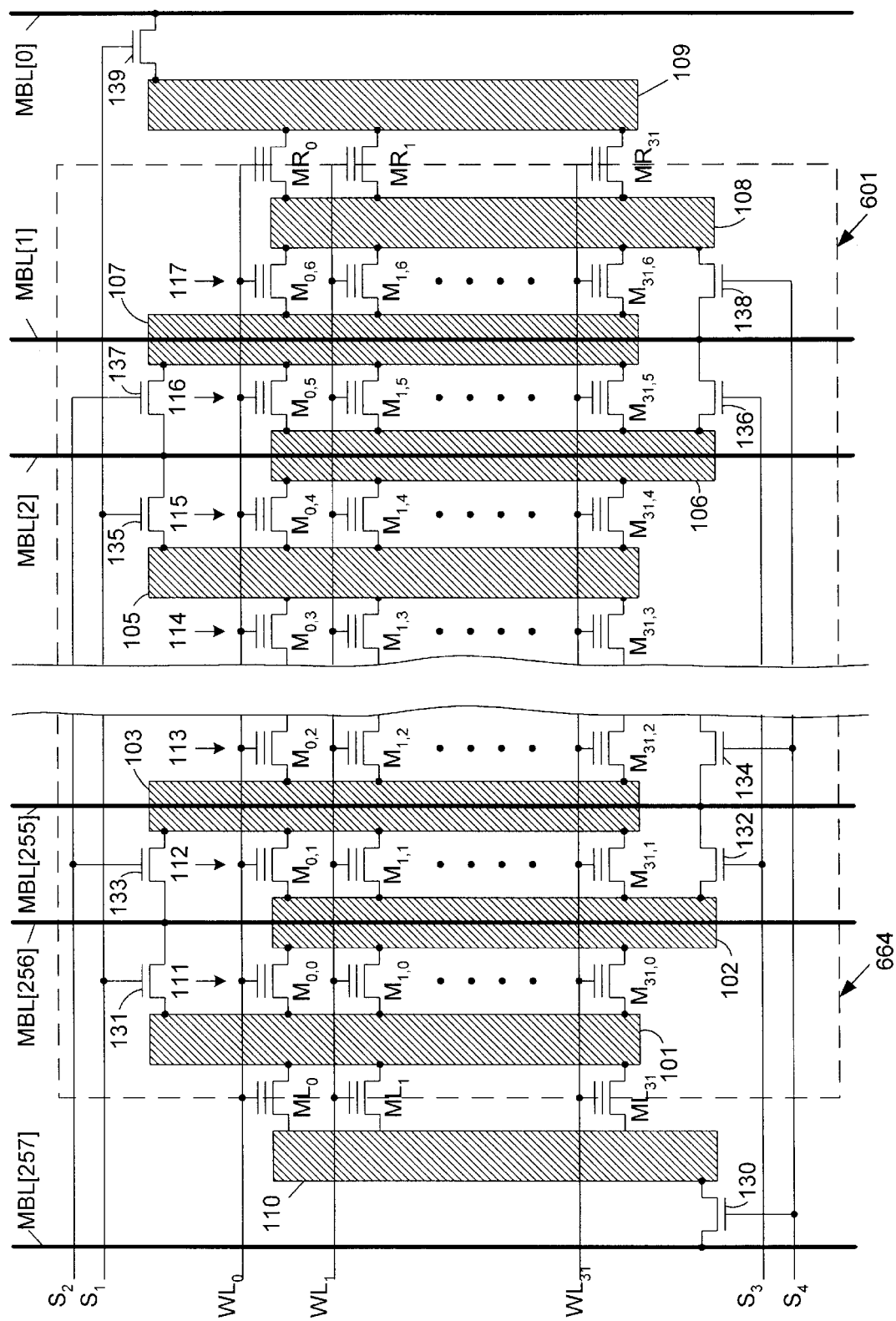
FIG. 6 is a schematic diagram illustrating additional diffusion bit lines, metal bit lines and select transistors connected at the left and right ends of a memory array in accordance with one embodiment of the present invention.

FIG. 6 is a schematic diagram illustrating the additional diffusion bit lines, metal bit lines and select transistors that are connected at the left and right edges of the memory array. In FIG. 6, only the left-most portion of a left-most memory block 664 and the right-most portion of a right-most memory block 601 are illustrated (i.e., memory blocks 602–663, which are located between memory blocks 601 and 664, are not illustrated). Because the left-most memory block 664 and the right-most memory block 601 are identical to memory block 100, the illustrated elements of memory blocks 664 and 601 are labeled with the same reference numbers as memory block 100. However, the metal bit lines are labeled as MBL[N] in FIG. 6, where N is an integer that identifies the metal bit line in the array. Thus, the right-most metal bit lines in memory block 601 are labeled MBL[2] and MBL[1]. Similarly, the left-most metal bit lines in memory block 664 are labeled as MBL[256] and MBL[255]. The 256 metal bit lines in the 64 memory blocks coupled along the first axis are therefore identified as metal bit lines MBL[256:1].

Diffusion bit line 110, metal bit line MBL[257] and select transistor 130 are located at the left edge of the array. Memory cells $ML_0$–$ML_{31}$ are formed between diffusion bit line 110 and diffusion bit line 101 of memory block 664. Select transistor 130 is connected between diffusion bit line 110 and metal bit line MBL[257]. The gate of select transistor 130 is coupled to select line $S_4$.

Similarly, diffusion bit line 109, metal bit line MBL[0] and select transistor 139 are located at the right edge of the array. Memory cells $MR_0$–$MR_{31}$ are formed between diffusion bit line 109 and diffusion bit line 108 of memory block 601. Select transistor 139 is connected between diffusion bit line 109 and metal bit line MBL[0]. The gate of select transistor 139 is coupled to select line $S_1$.

Because of the two additional metal bit lines MBL[257] and MBL[0] provided at the left and right edges of the memory array, the memory array has a total of 258 metal bit lines (i.e., MBL[257:0]). For reasons that are described in more detail in U.S. Pat. No. 6,081,456 by Oleg Dadashev, entitled "BIT LINE CONTROL CIRCUIT FOR A MEMORY ARRAY USING 2-BIT NON-VOLATILE MEMORY CELLS", issue Jun. 27, 2000, which is hereby incorporated by reference, only one of the charge trapping regions in left-most memory cells $ML_0$–$ML_{31}$ is used to store data bits. Similarly, only one of the charge trapping regions in right-most memory cells $MR_0$–$MR_{31}$ is used to store data bits.

Access having been provided to all of the memory cells, program, read and erase operations are performed as follows.

Read Operation

A single bit of memory block 100 is read as follows. The word line associated with the selected memory cell is maintained at a read voltage of 3 volts, while the word lines associated with the non-selected memory cells are held at a voltage of 0 Volts. One of the diffusion bit lines of the selected memory cell is held at a voltage of 2 Volts, and the other diffusion bit line of the selected memory cell is coupled to a sense amplifier (and held at a voltage of about 0 Volts), such that a reverse read conditions exist for the selected memory cell. For example, to read the right charge trapping region 2 of memory cell $M_{0,1}$, the word line $WL_0$ is held at a voltage of 3 Volts, while the word lines $WL_1$–$WL_{31}$ are held at 0 Volts. A voltage of 2 Volts is applied to diffusion bit line 102, and diffusion bit line 103 is coupled to a sense amplifier (0 Volts), thereby creating reverse read conditions for right charge trapping region 2 of memory cell $M_{0,1}$. Under these conditions, the non-selected memory cells are neither read nor disturbed.

Program Operation

For a programming operation, the word line associated with the selected memory cell is held at a programming voltage of 11 volts, while the word lines associated with the non-selected memory cells are held at a voltage of 0 Volts. The source region of the selected memory cell is maintained at a voltage of 0 Volts, and the drain region of the selected memory cell is maintained at a voltage of 5.5 Volts. For example, to program the right charge trapping region 2 of memory cell $M_{0,1}$, the word line $WL_0$ is held at a voltage of 11 Volts, while the word lines $WL_1$–$WL_{31}$ are held at 0 Volts. A voltage of 5.5 Volts is applied to diffusion bit line 103, and a voltage of 0 Volts is applied to diffusion bit line 102, thereby creating a program condition for right charge trapping region 2 of memory cell $M_{0,1}$. The duration of the programming operation is on the order of micro-seconds. Note that the duration of the programming operation is not long enough and the applied drain voltage of 5.5 Volts is not high enough to cause the non-selected memory cells to be erased during the programming operation.

Erase Operation

An erase operation is performed by applying 0 Volts to the gate of a selected memory cell and 8 Volts to the drain region of the selected memory cell. In general, erase operations in memory block 100 cannot be limited to a single memory cell. For example, an attempt to erase the right charge trapping region 2 of memory cell $M_{0,1}$ would proceed as follows. First, the select transistors 132 and 133 are turned on, thereby providing access to the second column of memory block 100 by coupling metal bit lines 141 and 142 to diffusion bit lines 103 and 102, respectively. An erase voltage of 8 Volts is applied to diffusion bit line 103, and an erase voltage of 0 Volts is applied to word line $WL_0$.

Under these conditions, the right charge trapping region 2 of memory cell $M_{0,1}$ is erased. However, under these conditions, the left charge trapping region 3 of the adjacent memory cell $M_{0,2}$ is also erased. Moreover, if the non-selected word lines $WL_1$–$WL_{31}$ are maintained at 0 Volts, then the right charge trapping regions of all of the memory cells in the second column and the left charge trapping regions of all of the memory cells in the third column are also erased. As a result, the erase operation will erase a minimum of 64 bits. Raising the voltages on the non-selected word lines may eliminate the erase conditions, but may, in turn, create undesirable programming conditions.

Because a normal erase operation will erase at least 64 bits, one erase option is to erase the entire memory block 100 at the same time, thereby operating memory block 100 as a flash memory. To erase the entire memory block 100, all of the word lines $WL_0$–$WL_{31}$ are held at 0 Volts, and all of the diffusion bit lines 101–108 are held at a voltage of 8 Volts. The duration of the erase operation is on the order of milli-seconds.

As described above, a normal erase operation in memory block 100 will erase at least 64 bits. However, to operate memory block 100 as an EEPROM, there must be a mechanism for erasing data on a word-by-word basis. It would therefore be desirable to modify the erase operation of memory block 100, such that memory block 100 can be erased on a word-by-word basis. In one embodiment of the present invention, the method of operating memory block 100 is modified such that memory block 100 emulates EEPROM. To accomplish this emulation, a single bit of memory block 100 is erased in the following manner.

Figure 7:
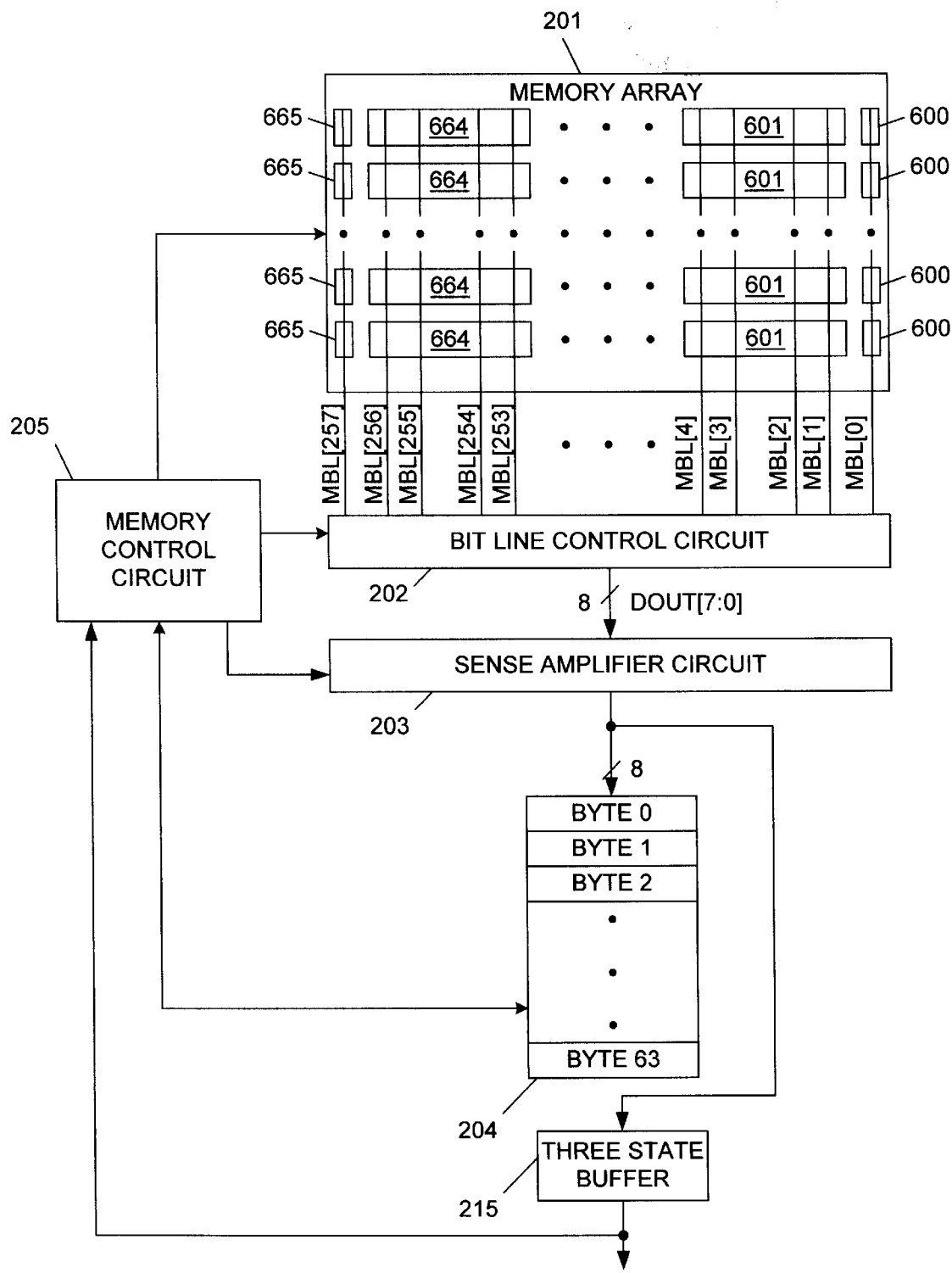
FIG. 7 is a block diagram of a circuit that emulates per bit erasing of the memory block of FIG. 3 in accordance with one embodiment of the present invention.

FIG. 7 is a block diagram of an erase emulation structure 200 that emulates word-by-word erasing in a memory array that uses memory block 100. Emulation structure 200 includes memory array 201, bit line control circuit 202, sense amplifier circuit 203, 64 word storage device 204, three state buffer 215, and memory control circuit 205. Memory array 201 is formed from a plurality of memory blocks identical to memory block 100. The metal bit lines of memory array 201 are routed to bit line control circuit 202. Bit line control circuit 202 is controlled to apply the appropriate read, program and erase voltages to the metal bit lines MBL[257:0]. During a read operation, bit line control circuit 202 also routes an addressed set of eight bit lines to sense amplifier circuit 203 in response to a column address received from memory control circuit 205. Bit line control circuit 202 is described in more detail in commonly owned, co-filed U.S. Pat. No. 6,081,451, by Oleg Dadashev, entitled BIT LINE CONTROL CIRCUIT FOR A MEMORY ARRAY USING 2-BIT NON-VOLATILE MEMORY CELLS, issued Jun. 27, 2000, which is hereby incorporated by reference.

The number of bit lines routed to sense amplifier circuit 203 is selected to correspond with the word width of memory array 201. In the described example, this word width is 8 bits. Note that each bit of the 8-bit word routed to sense amplifier circuit 203 is received from a different memory block within memory array 201. Sense amplifier circuit 203 is coupled to storage device 204. Storage device 204 is configured to store 64 8-bit values. Memory control circuit 205 provides address signals to control the access of storage device 204. Storage device 204 can be, for example, a static random access memory (SRAM). Sense amplifier 203 is also coupled to three state buffer 215.

The operation of erase emulation circuit 200 will now be described in connection with an example. This example describes the process required to erase one bit in a memory block within memory array 201 at a write address W_ADDR. However, it is understood that this process is simultaneously performed for 8 bits in 8 different memory blocks, such that an entire word is erased. The present example assumes that it is desired to erase the bit stored in the right charge trapping region 2 of memory cell $M_{0,1}$ (FIG. 3).

First, memory control circuit 205 controls memory array 201 and bit line control circuit 202 such that the bit stored in the right charge trapping region of memory cell $M_{0,1}$ is read. Memory control circuit 205 further controls bit line control circuit 202 to route this bit (along with the seven other addressed bits of the word) to sense amplifier circuit 203 and storage device 204. Memory control circuit 205 causes the accessed bit (word) to be written to the first entry of storage device 204.

Memory control circuit 205 then sequentially performs read accesses of the right charge trapping regions of memory cells $M_{1,1}$–$M_{31,1}$. That is, memory control circuit 205 sequentially reads the bits from the right charge trapping regions of all of the memory cells in the second column. The bits read are stored in sequential locations in storage device 204 under the control of memory control circuit 205.

Memory control circuit 205 then sequentially performs read accesses of the bits stored in the left charge trapping regions of memory cells $M_{0,2}$–$M_{31,2}$. That is, memory control circuit 205 causes the bits from the left charge trapping regions of all of the memory cells in the third column to be sequentially read. These bits are stored in sequential locations in storage device 204 under the control of memory control circuit 205.

After these 64 read operations have been completed, all of the bits that would have been erased by erasing the right charge trapping region 2 of memory cell $M_{0,1}$ are stored in storage device 204. At this time, memory control circuit 205 performs an erase operation that erases the right charge trapping region 2 of memory cell $M_{0,1}$. As described above, this erase operation also erases the right charge trapping regions of memory cells $M_{1,1}$–$M_{31,1}$ and the left charge trapping regions of memory cells $M_{0,2}$–$M_{31,2}$.

After the erase operation has been completed, memory control circuit 205 performs 63 consecutive programming operations to restore the bits from storage device 204 to the right charge trapping regions of memory cells $M_{1,1}$–$M_{31,1}$ and the left charge trapping regions of memory cells $M_{0,2}$–$M_{31,2}$. That is, the bits are restored to the left charge trapping regions of all of the memory cells in the third column, and to the right charge trapping regions of all of the memory cells in the second column, except for the right charge trapping region of memory cell $M_{0,1}$. The net effect of these operations is to erase only the bit stored in the right charge trapping region of memory cell $M_{0,1}$. In the foregoing manner, memory array 201 can be erased on a word-by-word basis, thereby enabling memory array 201 to be operated as an EEPROM array. Note that a bit stored in the left charge trapping region of a memory cell can be erased in a similar manner.

The time required to read the 64 bits from memory array 201 is on the order of nano-seconds. The time required to perform the erase operation is on the order of tens of milli-seconds. The time required to re-program each of the 63 bits back into memory array 201 is on the order of micro-seconds. Consequently, the time required to read and restore the 63 bits that are not being erased is a small percentage (i.e., about 1 percent) of the total erase time.

In a variation of the above-described embodiment, memory controller 205 does not cause the bit to be erased to be read and stored in storage device 204. In the above described example, the bit stored in the right charge trapping region of the memory cell MoN, would not be read (since this bit is going to be subsequently erased). As a result, only 63 read operations are performed prior to the erase operation.

It is understood that the endurance of memory array 201 may be limited in the present embodiment, because on average, the memory cells of memory array 201 will be erased and programmed approximately 63 times more often than memory cells in an equivalent flash memory. However, it is understood that this loss of endurance is acceptable in certain applications where memory array 201 is not expected to be re-programmed a large number of times. Furthermore, FIGS. 9–13 provide a method and a circuit to minimize the number of times a memory cell is erased or programmed in accordance with another embodiment of the present invention.

Figure 8:
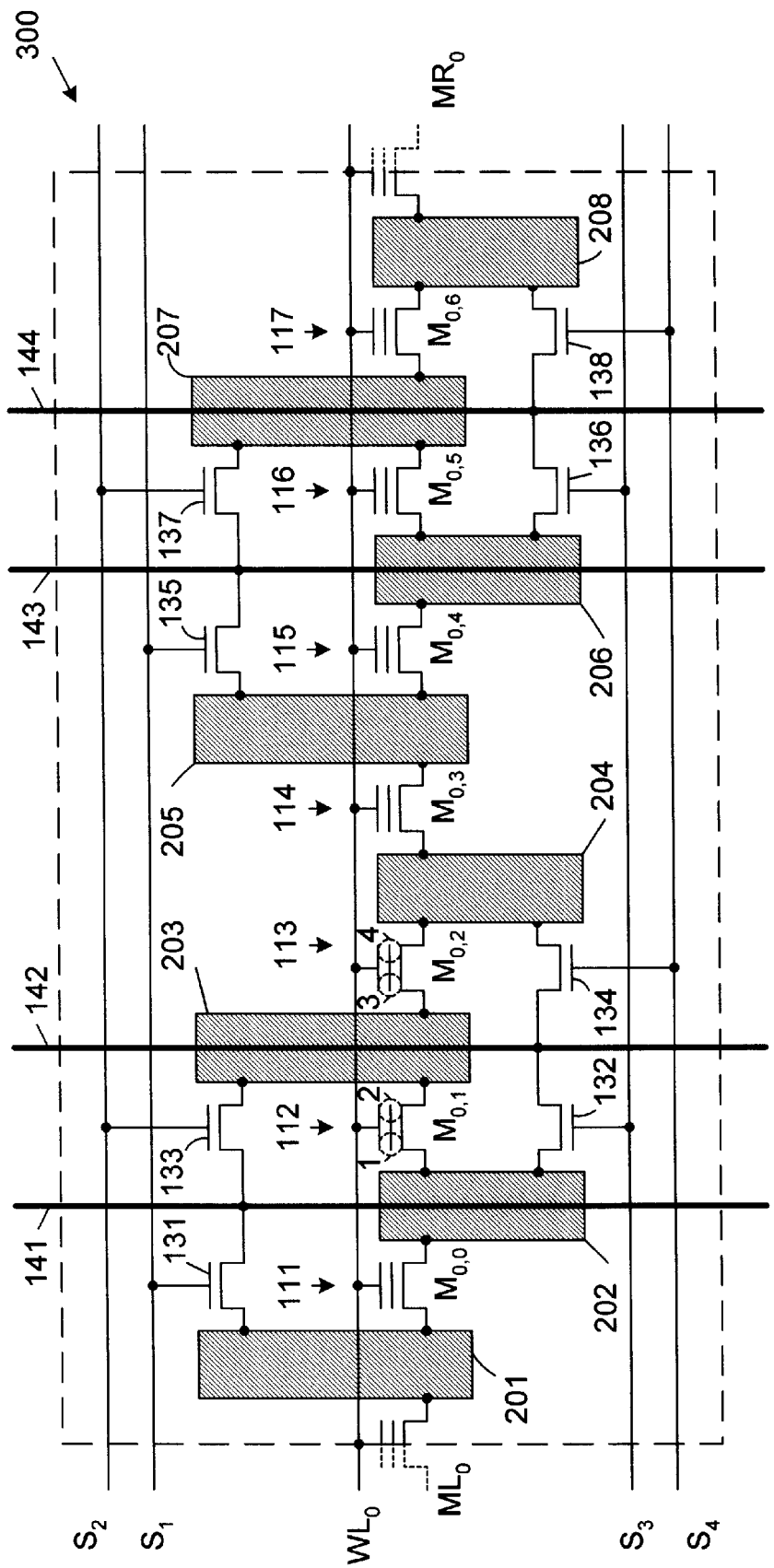
FIG. 8 is a schematic diagram of a memory block in accordance with another embodiment of the present invention.

FIG. 8 is a schematic diagram of a memory block 300 in accordance with another embodiment of the present invention. Because memory block 300 is similar to memory block 100 (FIG. 3), similar elements in FIGS. 3 and 8 are given similar reference numbers. Thus, memory block 300 includes memory cells $M_{0,0}$–$M_{0,6}$, shared memory cells $ML_0$ and $MR_0$, select transistors 131–138 and metal bit lines 141–144. Diffusion bit lines 101–108 of memory block 100 are replaced by diffusion bit lines 201–208 in memory block 300. As illustrated in FIG. 8, memory block 300 has only one row of memory cells, which includes memory cells $M_{0,0}$–$M_{0,6}$ and shared memory cells $ML_0$ and $MR_0$. As a result, the diffusion bit lines 201–208 of memory block 300 are much shorter along the second axis than the diffusion bit lines 101–108 of memory block 100. Select transistors 131–138 are connected to diffusion bit lines 201–208 in the same manner that select transistors 131–138 are connected to diffusion bit lines 101–108 in memory block 100 (FIG. 3). Similarly, select transistors 131–138 are connected to metal bit lines 141–144 and select lines S1–S4 in the manner previously described for memory block 100 (FIG. 3). A plurality of memory blocks identical to memory block 300 can be coupled together along the first and second axes, thereby forming a larger memory array.

Memory block 300 is controlled as follows. The memory cells of memory block 300 are programmed in the same manner as the memory cells of memory block 100. However, only the memory cells being programmed are exposed to the bit line programming voltages. As a result, there is less chance for disturb conditions to exist in non-selected memory cells during a programming operation in memory block 300. The memory cells of memory block 300 are read in the same manner as the memory cells of memory block 100.

In one embodiment, erase operations are carried out in memory block 300 in accordance with the following example. To erase the bit stored in the right charge trapping region 2 of memory cell $M_{0,1}$, the following steps are performed. First, the bit stored in the left charge trapping region 3 of the right-adjacent memory cell $M_{0,2}$ is read from memory block 300 and stored in a storage device. This storage device is similar to storage device 204 (FIG. 7), but has a depth of one word instead of 64 words. An erase operation is then performed to erase the bit stored in the right charge trapping region 2 of memory cell $M_{0,1}$. As described above, this erase operation also erases the bit stored in the left charge trapping region 3 of right-adjacent memory cell $M_{0,2}$. After the erase operation has been completed, the bit previously read from the left charge trapping region 3 of memory cell $M_{,0,2}$ is written from the storage device back to the left charge trapping region 3 of memory cell $M_{0,2}$. The net result is that the right charge trapping region 2 of memory cell $M_{0,1}$ is erased. Although the present example is described in connection with a single bit in memory block 300, it is understood that another seven bits in similar memory blocks are controlled in the same manner in parallel, such that an 8-bit word is erased during an erase operation. Moreover, it is also understood that the left charge trapping region 3 of memory cell $M_{0,2}$ can be erased by reading the bit stored in the right charge trapping region 2 of memory cell $M_{0,1}$ performing the erase operation, and then restoring the bit to the right charge trapping region 2 of memory cell $M_{0,1}$.

As described above, the erase operation of memory block 300 is similar to the erase operation of memory block 100. However, memory block 300 will exhibit greater endurance than memory block 100, because on average, the memory cells of memory block 300 are programmed and erased twice as often as a comparable flash memory, rather than 63 times as often, as was the case for memory block 100. However, memory block 300 is less area efficient than memory block 100, because memory block 300 requires a full set of select transistors 131–138 for each row of memory cells.

In accordance with another embodiment of the invention, memory block 300 is an EEPROM, and operates memory cells $M_{0,0}$–$M_{0,6}$, $ML_0$ and $MR_0$ as 1-bit memory cells. For example, in one embodiment, only the right charge trapping regions of memory cells $M_{0,0}$–$M_{0,6}$, $ML_0$ and $MR_0$ are used to store data. In this embodiment, the left charge trapping regions of these memory cells are not used to store data. Thus, erase operations are carried out simply by erasing the right charge trapping region of the desired memory cell. Even though the left charge trapping region of the right adjacent memory cell is incidentally erased, this is irrelevant because this left charge trapping region is not used to store data. Moreover, there is no detrimental over-erase condition associated with the left charge trapping region under these conditions. In this manner, memory block 300 can advantageously be operated as EEPROM in accordance with this embodiment. In a variation of this embodiment, only the left charge trapping regions are used to store data.

In accordance with another embodiment of the present invention, the endurance of a memory array having multi-bit word access is increased by reducing the number of times a memory cell is programmed or erased. Typically, to write a new data word into a non-volatile memory array at a specific write address, all the memory cells at the write address are erased, then all the memory cells at the write address are programmed based on the value of the new data word. However, in accordance with the present invention, rather than erasing and programming all the memory cells at the write address, only the memory cells which must transition from a programmed state to an erased state are erased, and only the memory cells which must transition from an erased state to a programmed state are programmed. Typically, the erased state corresponds to a logic high and the programmed state corresponds to a logic low.

For example, if a new data word, which equals 11011100, is to be written into a memory array at write address W_ADDR, conventional memory systems would simply erase all eight memory cells at write address W_ADDR and then program the memory cells at bits 5, 1, and 0 (numbering from right to left starting with 0) at of write address W_ADDR. However, in accordance with the present invention, the current value stored at write address W_ADDR is read and compared with the new data word. Assuming the current data word equals 10110010, comparison with the new data word shows that bits 7, 4, and 0 are the same in both the new data word and the current data word. Therefore, memory cells at bits 7, 4, and 0 do not need to be programmed or erased. Bits 6, 3, and 2 of the current data word are programmed but must be erased to form the new data word (i.e. are at logic low but must be erased to be at logic high). Bits 5 and 1 of the current data word are not programmed but must be programmed to form the new data word (i.e. are at logic high but must be programmed to be at logic low). Thus, in accordance with the present invention, only memory cells corresponding to bits 6, 3, and 2 are erased. Conversely, only bits 5 and 1 are programmed.

On average, the present invention reduces the number of times a memory cell is erased by 75%. Similarly, the present invention reduces the number of times a memory cell is programmed by 75%. Since the endurance of a cell is inversely proportional to the number of times a memory cell is programmed and erased, the present invention increases the endurance of the memory cells of a memory array by approximately 300%.

Figure 9A:
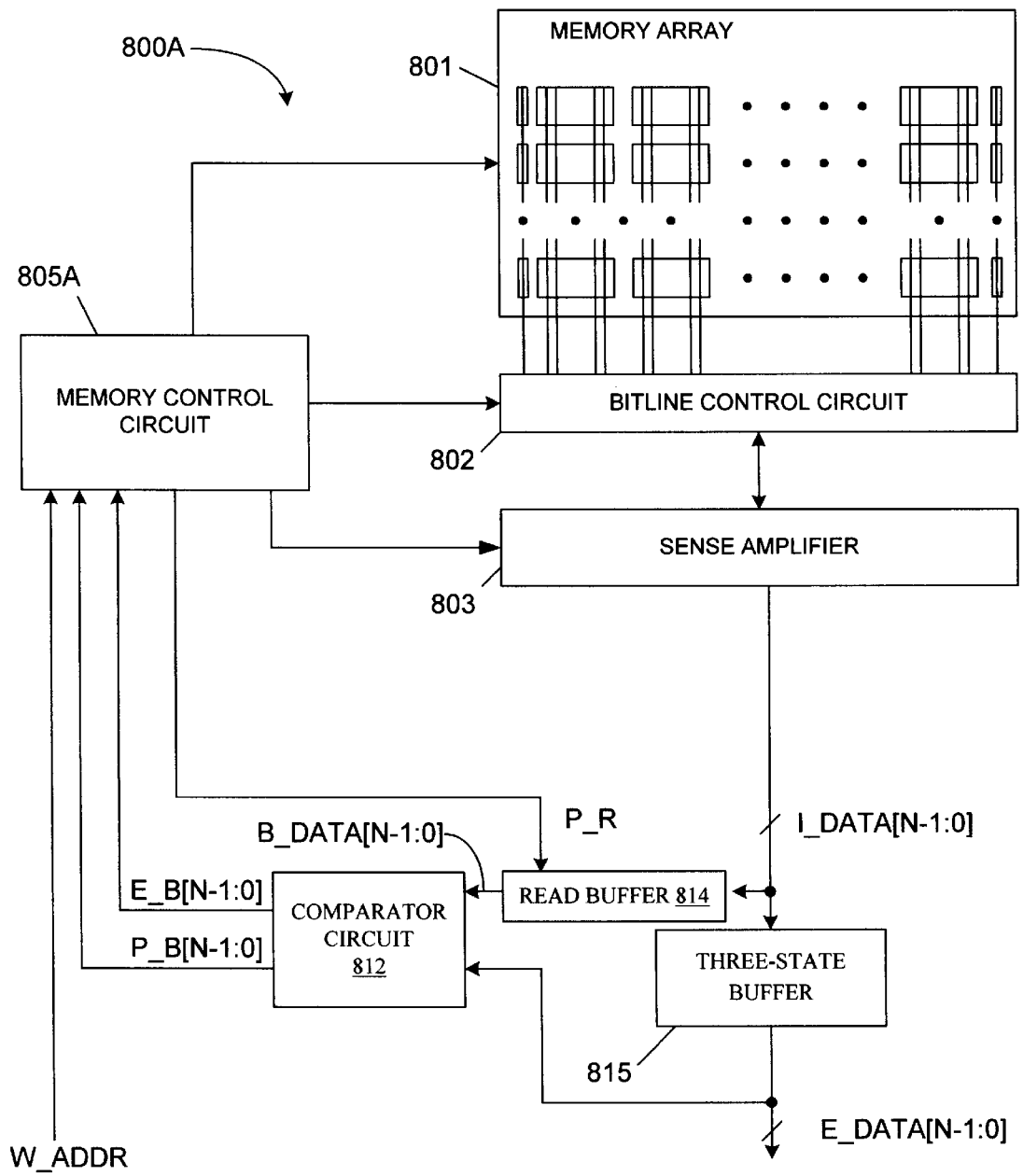
FIG. 9A is a block diagram of a memory circuit using a comparator circuit to increase the endurance of a memory cell in accordance with one embodiment of the present invention.

FIG. 9A is a block diagram of a memory circuit 800A which increases the endurance of memory cells in accordance with one embodiment of the present invention. Memory circuit 800A includes a memory array 801, a bit line control circuit 802, a sense amplifier 803, a memory control circuit 805A, a comparator circuit 812, a read buffer 814, and a three state buffer 815. Memory array 801 has a data word of size N. Memory array 801 can be a conventional EEPROM memory array or a memory array such as memory array 201. Bit line control circuit 802 is controlled by memory control circuit 805A to drive various erase, program, and read voltages on a predetermined set of bit lines during erase, program and read operations, respectively. Furthermore during reads, bit line control circuit 802 is controlled to route signals from a predetermined set of bit lines to sense amplifier 803 in response to a column address received from memory control circuit 805A.

During a read cycle from memory array 801, sense amplifier 803 generates internal data signals I_DATA[N-1:0] based on the contents of memory array 801. Specifically, memory array 801 contains N memory cells at each memory address, each internal data signal I_DATA[X] corresponds to one memory cell at each memory address. During read cycles, three-state buffer 815 drives internal data signals I_DATA[N-1:0] to external data signals E_DATA[N-1:0]. Each external data signal E_DATA[X] corresponds to an internal data signal I_DATA[X] and to the memory cell which corresponds to internal data signal I_DATA[X], where X is an integer from 0 to N-1.

During a programming cycle, a new data word on external data signals E_DATA[N-1:0] is to be written into memory array 801 at a write address W_ADDR. Specifically, the logic level of each external data signal E_DATA[X] is to be programmed into the corresponding memory cell of memory array 801 at write address W_ADDR. In conventional memory circuits, all the memory cells at write address W_ADDR would be erased and then each memory cells which correspond to an external data signal E_DATA[X], having a programmed logic level would be programmed. Thus, in conventional memory circuits every memory cell at write address W_ADDR is erased during every programming cycle that accesses write address W_ADDR.

For clarity, all examples and circuit diagrams presented herein use memory cells which in their programmed state provide for logic low output signal, and in their erased state provide a logic high output signal. Thus, in the examples presented herein, the programmed logic level is logic low and the erased logic level is logic high.

By using comparator circuit 812 and read buffer 814, the present invention can implement programming without erasing every memory cell at write address W_ADDR. Specifically, in accordance with the present invention, at the beginning of a program cycle, memory control circuit 805A performs a program read operation at write address W_ADDR. In a program read operation, the contents of memory array 801 at write address W_ADDR is driven to internal data signals I_DATA[N-1:0]. However, three state buffer 815 is configured into a high impedance mode to isolate internal data signals I_DATA[N-1:0] from external data signals E_DATA[N-1:0]. Memory control circuit 805A drives an active edge (typically, a rising edge) on program read signal P_R to read buffer 814 to cause read buffer 814 to store internal data signals I_DATA[N-1:0].

The contents of read buffer 814 are driven on buffered data signals B_DATA[N-1:0] to comparator circuit 812. Comparator circuit 812 also receives external data signals E_DATA[N-1:0]. Comparator circuit 814 compares each bit of buffered data signals B_DATA[N-1:0] with a corresponding bit from external data signals E_DATA[N-1:0] to generate N erase bit signals E_B[N-1:0] and N program bit signals P_B[N-1:0]. Each erase bit signal E_B[X] indicates whether the memory cell at write address W_ADDR corresponding to external data signal E_DATA[X] should be erased. Similarly, each program bit signal P_B[X] indicates whether the memory cell at write address W_ADDR corresponding to external data signal E_DATA[X] should be programmed. TABLE 1 provides the logic function performed by comparator circuit 812 in which a memory cell at logic low is in a programmed state, a memory cell at logic high is in an erased state, the active logic level for erase bit signal E_B[X] is logic high, and the active logic level for program bit signal P_B[X] is also logic high.

TABLE 1

| B_DATA[X] | E_DATA[X] | E_B[X] | P_B[X] |
|---|---|---|---|
| 0 | 0 | 0 | 0 |
| 0 | 1 | 1 | 0 |
| 1 | 0 | 0 | 1 |
| 1 | 1 | 0 | 0 |

Erase bit signals E_B[N-1:0] and program bit signals P_B[N-1:0] are driven to memory control circuit 805A. Memory control circuit 805A performs an erase operation at write address W_ADDR by controlling bit line control circuit 802 to drive erase voltages only on bit lines corresponding to memory cells which correspond to erase bit signals E_B[N-1:0], which are at the active logic level. Thus, only memory cells corresponding to an erase bit signal E_B[X], which is at the active logic level are erased. Memory control circuit 805A then performs a program operation at write address W_ADDR by controlling bit line control circuits to drive program voltages on bit lines corresponding to memory cells which correspond to program bit signals P_B[N-1:0], which are at the active logic level. Thus, only memory cells corresponding to a program bit signal P_B[X], which is at the active logic level are programmed.

For example, if the memory cells at write address W_ADDR contain the value 01010111 and the external data signals E_DATA[N-1:0] has the value 00110011, bits 6, 4, 2, 1 and 0 (numbering from right to left starting with 0) are already in the erased state and do not need to be erased. Bits 7 and 3, do not need to be erased because the memory cells are already in the state dictated by data signals E_DATA[N-1:0]. Thus, only bit 5 needs to be erased. Accordingly, comparator circuit 812 drives erase bit signal E_B[5] to the active logic level, and erase bit signals E_B[7:6] and E_B[4:0] to the inactive logic level. Conversely, bits 7, 5, and 3 are already in the programmed state and do not need to be programmed again. Bits 4, 1, and 0 do not need to be programmed because the memory cells are already in the state dictated by external data signals E_DATA[N-1:0]. Thus only bits 6 and 2 need to be programmed. Accordingly, comparator circuit 812 drives program bit signals P_B[6] and P_B[2] to the active logic level and drives program bits P_B[7], P_B[5:3] and P_B[2:0] to the inactive logic level. Memory control circuit 805A performs an erase cycle by causing bit line control circuit 802 to erase only the memory cell corresponding to erase bit signal E_B[5]. Then, memory control circuit 805A performs a program cycle by causing bit line control circuit 802 to program only the memory cells corresponding to program bit signals P_B[6] and P_B[2].

In conventional memory circuits, all the memory cells at write address W_ADDR would be erased. Furthermore, memory cells corresponding to bits 2, 3, 6 and 7 would be programmed. Thus, by using comparator circuit 812 and read buffer 814, memory circuit 800A reduces the number of times a memory cell is erased compared to conventional memory circuits. Consequently the endurance of the memory cells in memory array 801 is increased.

Figure 9B:
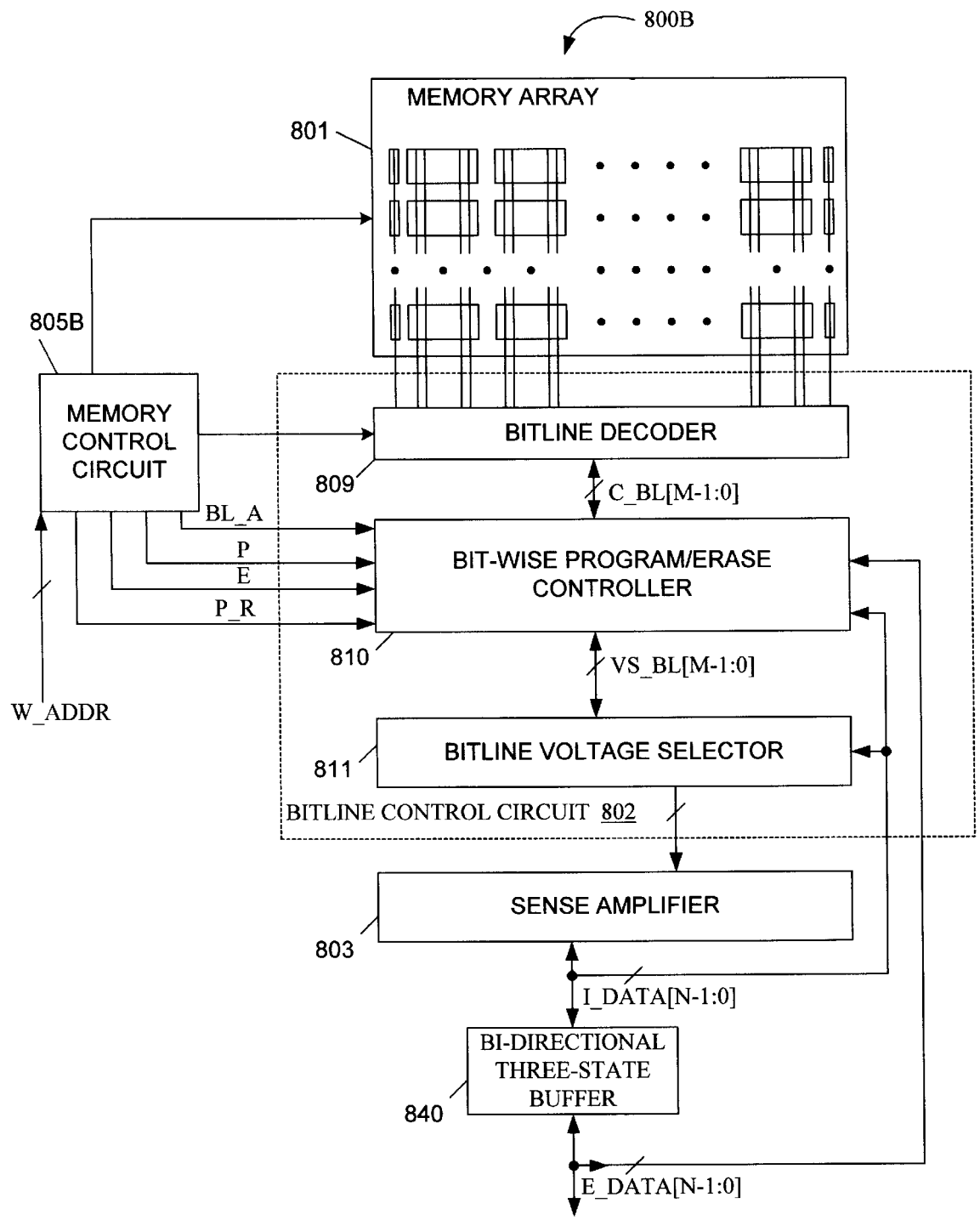
FIG. 9B is a block diagram of a memory circuit using a bit-wise program/erase controller to increase the endurance of a memory cell in accordance with one embodiment of the present invention.

FIG. 9B is a block diagram of a memory circuit 800B which increases the endurance of memory cells in accordance with another embodiment of the present invention. Memory circuit 800B includes memory array 801, a bit line control circuit 802, a sense amplifier 803, a memory control circuit 805B, and a bi-directional three state buffer 840. In the embodiment of FIG. 9B., bit line control circuit 802 includes a bit line decoder 809, a bit-wise program/erase controller 810, and a bit line voltage selector 811. The access bit lines of memory array 801 are routed to bit line decoder 809. Bit line decoder 809 is controlled to route a predetermined number of bit line pairs to bit-wise program/erase controller 810 in response to a column address received from memory control circuit 805B. The number of bit line pairs routed to bit-wise program/erase controller is selected to correspond with the width of a data word for memory array 801. Thus, bit line decoder 809 is coupled to bit-wise program/erase controller by M controlled bit lines C_BL[M-1:0] which form N controlled bit line pairs C_BL_P[N-1:0]. As used herein, N is the number of bits in a data word of memory array 801. M is greater than or equal to two times N. For example, in one embodiment, bit line decoder 809 provides 18 bit lines (i.e. M=18) which are paired off into 8 bit line pairs (i.e. N=8) and two extra bit lines. The exact pairings for bit line decoder 809 differs depending on the memory address being accessed.

Bit-wise program/erase controller 810 is coupled to bit line voltage selector 811 by M voltage select bit lines VS_BL[M-1:0] which form voltage select bit line pairs VS_BL_P[N-1:0]. Each voltage select bit line pair corresponds to one controlled bit line pair. Specifically, voltage select bit line pair VS_BL_P[X] corresponds to controlled bit line pair C_BL_P[X].

Bit-wise program/erase controller 810 also receives bit line alignment signals BL_A, a program signal P, a erase signal E, and a program read signal p_R from memory control circuit 805B. Memory control circuit 805B indicates which controlled bit lines C_BL[M-1:0] form controlled bit line pairs C_BL_P[N-1:0] and which voltage select bit lines VS_BL[M-1:0] for voltage select bit line pairs VS_BL_P[N-1:0]. Memory control circuit 805B drives program signal P to an active logic level (typically logic high) when memory cells in memory array 801 are being programmed. Conversely, memory control circuit 805B drives erase signal E to an active logic level (typically logic high) when memory cells in memory array 801 are being erased.

Memory control circuit 805B drives an active edge (typically a rising edge) on program read signal P_R when memory control circuit 805B reads memory array 801 at write address W_ADDR for bit-wise program/erase controller 810. As stated above, for clarity, all examples and circuit diagrams presented herein use memory cells which are programmed for logic low and erased for logic high. Furthermore, all signals are active high, thus, for example, the active logic level of program signal P is logic high. Similarly, the active level of erase signal E is logic high. In addition, the active edges of all edge sensitive signals, such as program read signal PR, are rising edges. One skilled in the art can adapt the examples and circuits given herein to use different active low signal and falling edges in accordance with the principles of the present invention.

In a programming operation of memory array 801, a new data word on external data signals E_DATA[N-1:0] is to be written into memory array 801 at write address W_ADDR. During the programming operation, memory control circuit 805B reads the memory cells at write address W_ADDR. Therefore, bit line decoder 809 routes the bit lines of the memory cells at write address W_ADDR to bit-wise program/erase controller 810. During read cycles, bit-wise program/erase controller 810 couples each controlled bit line pair C_BL_P[X] to the corresponding voltage select bit line pair VS_BL_P[X]. Bit line voltage selector 811 provides signals to sense amplifier 803, which detects the state of the memory cells and drives the current data word at write address W_ADDR on internal data signals I_DATA[N-1:0]. Thus, internal data signals I_DATA[N-1:0] provide the current data word in the memory cells at write address W_ADDR to bit-wise program/erase controller 810. As used herein, each internal data signal I_DATA[X] corresponds to a voltage select bit line pair VS_BL_P[X] and a controlled bit line pair C_BL_P[X], where X is an integer from 0 to N-1.

Memory control circuit 805B then performs an erase operation on the memory cells at write address W-ADDR. Bit line voltage selector 811 provides erase voltages on selected voltage select bit line pairs VS_BL_P[N-1:0]. However, bit-wise program/erase controller 810 only couples a voltage select bit line pair VS_BL_P[X] to the corresponding controlled bit line pair C_BL_P[X] for those bits in which the corresponding memory cell at write address W_ADDR is currently programmed but must be erased due to the value on external data signals E_DATA[X], i.e. if the memory cell is at a programmed level as indicated by internal data signal I_DATA[X] being in a programmed logic level and if external data signal E_DATA[X] is at an erased logic level. As used herein, each external data signal E_DATA[X] corresponds to an internal data signal I_DATA[X], a voltage select bit line pair VS_BL_P[X] and controlled bit line pair C_BL_P[X], where X is an integer from 0 to N-1.

For example, if the memory cells at write address W_ADDR contain the value 01010111 and the external data signals E_DATA[N-1:0] has the value 00110011, bits 6, 4, 2, 1 and 0 (numbering from right to left starting with 0) are already in the erased state and do not need to be erased again. Bits 7 and 3, do not need to be erased because the memory cells are already in the state dictated by data signals E_DATA[N-1:0]. Thus, only bit 5 needs to be erased. Accordingly, bit-wise program/erase controller 810 only routes voltage select bit line pair VS_BL_P[5] to controlled bit line pair C_BL_P[5]. The other select bit line pairs are isolated from the controlled bit lines pairs so that the corresponding memory cells are not erased when the memory cell corresponding to controlled bit line pair C_BL_P[5] is erased. In some embodiments, the other controlled bit line pairs are grounded. In conventional memory circuits, all the memory cells at write address W_ADDR would be erased. Thus, by incorporating a bit-wise program/erase controller, memory circuit 800B reduces the number of times a memory cell is erased compared to conventional memory circuits. Consequently the endurance of the memory cells in memory array 801 is increased.

Memory control circuit 805B then performs a program operation on the memory cells at write address W_ADDR. Bi-directional three-state buffer 840 is configured to drive external data signals E_DATA[N-1:0] to bit line voltage selector 811. Bit line voltage selector 811 generates the program voltages on voltage select bit line pairs VS_BL_P[N-1:0] based on external data signals E_DATA[N-1:0]. However, bit-wise program/erase controller 810 only passes the signals from each voltage select bit line pair VS_BL_P[X] to the corresponding controlled bit line pair C_BL_P[X] for those bits in which the corresponding memory cell at write address W_ADDR is currently not programmed but must be programmed due to the value of external data signal E_DATA[X], i.e. the memory cell is in an erased state as indicated by internal data signal I_DATA[X] being at an erased logic level and external data signal E_DATA[X] being in a programmed logic level. For example, if the memory cells at write address W_ADDR contain the value 01110111 and the external data signals E_DATA[N-1:0] have the value 00110011, bits 7 and 3 (numbering from right to left starting with 0) are already in the programmed state and do not need to be programmed again. Bits 5, 4, 1, and 0, do not need to be programmed because the memory cells are already in the state dictated by data signals E_DATA[N-1:0]. Thus, only bits 6 and 2 need to be programmed. Accordingly, bit-wise program/erase controller 810 only routes voltage select bit lines pairs VS_BL_P[6] and VS_BL_P[2] to controlled bit lines pairs C_BL_P[6] and C_BL_P[2], respectively. The other controlled bit line pairs are isolated from the corresponding voltage select bit line pairs so that the corresponding memory cells are not programmed when the memory cells corresponding to controlled bit line pairs C_BL_P[6] and C_BL_P[2] are programmed. In some embodiments, the other controlled bit line pairs are grounded. In conventional memory systems, all the memory cells which had to transition to the programmed state would have been programmed. Thus, by incorporating a bit-wise program/erase controller 810, memory circuit 800B reduces the number of times a memory cell is programmed compared to conventional memory circuits. Consequently the endurance of the memory cells in memory array 801 is increased.

Figure 10:
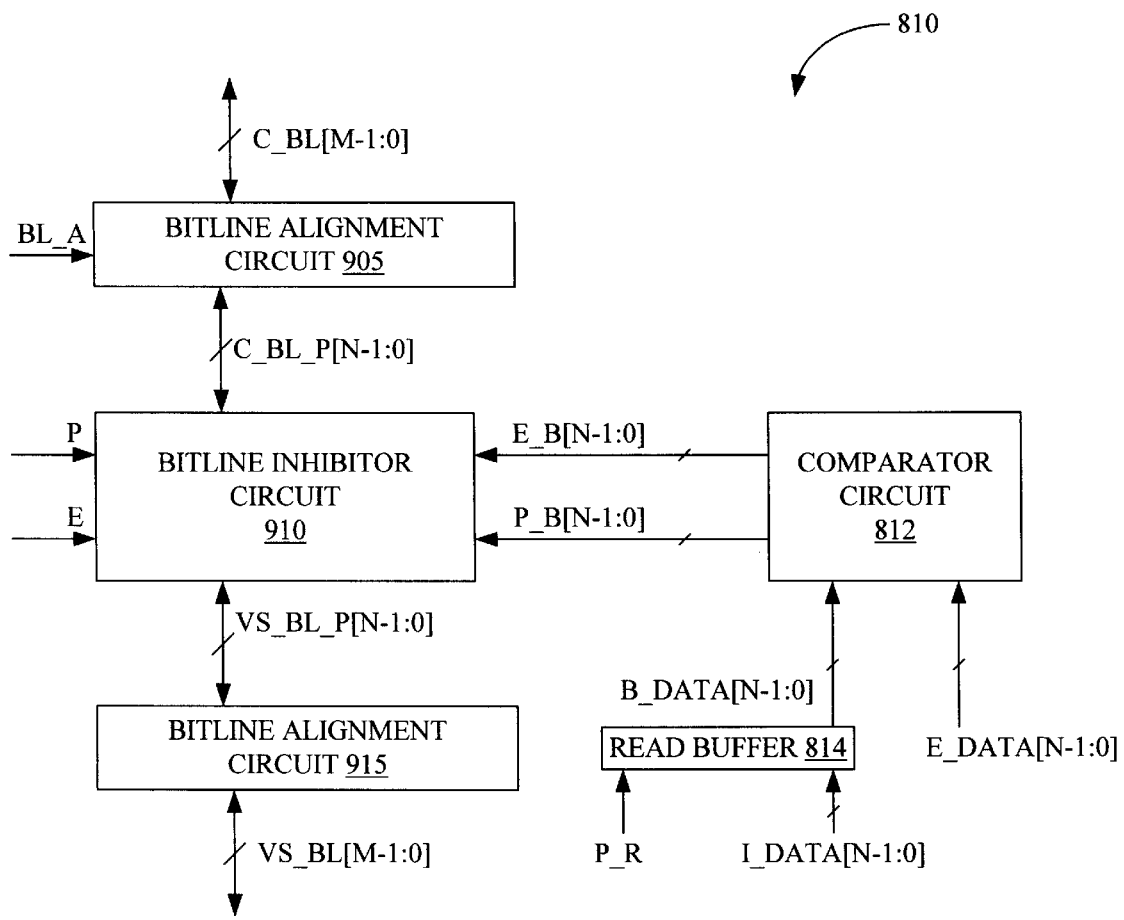
FIG. 10 is a block diagram of a bit-wise program/erase controller in accordance with one embodiment of the present invention.

FIG. 10 is a block diagram of an embodiment of bit-wise program/erase controller 810 in accordance with one embodiment of the present invention. The embodiment of FIG. 10, comprises a first bit line alignment circuit 905, a second bit line alignment circuit 915, a bit line inhibitor circuit 910, a comparator circuit 812, and a read buffer 814. The comparator circuit and read buffer of FIG. 10 can be identical to the comparator circuit and read buffer of FIG. 9A thus the same reference numerals are used. Read buffer 814 stores internal data signals I_DATA[N-1:0] on each active edge of program read signal PR. The value in read buffer 814 is driven to comparator circuit 812 on buffered data signals B_DATA[N-1:0].

Comparator circuit 812 also receives external data signals E_DATA[N-1:0]. Comparator circuit 812 compares each bit of buffered data signals B_DATA[N-1:0] with a corresponding bit from external data signals E_DATA[N-1:0] to generate N erase bit signals E_B[N-1:0] and N program bit signals P_B[N-1:0]. Each erase bit signal E_B[X] indicates whether the memory cell at write address W_ADDR corresponding to controlled bit line pair C_BL_P[X] should be erased during the next erase cycle. Similarly, each program bit signal P_B[X] indicates whether the memory cell at write address W_ADDR corresponding to controlled bit line pair C_BL_P[X] should be programmed during the next program cycle. As explained above, TABLE 1 provides the logic function performed by comparator circuit 812.

Erase bit signals E_B[N-1:0] and program bit signals P_B[N-1:0] are driven to bit line inhibitor circuit 910. Bit line inhibitor circuit 910 receives program signal P and erase signal E from memory control circuit 801 (FIG. 8). Bit line alignment circuit 905 aligns controlled bit lines C_BL[M-1:0] into controlled bit line pairs C_BL_P[N-1:0] for bit line inhibitor circuit 910 as dictated by bit line alignment signals BL_A. Similarly, alignment circuit 915 aligns voltage select bit lines VS_BL[M-1:0] into voltage select bit line pairs VS_BL_P[N-1:0] for bit line inhibitor circuit 910 as dictated by bit line alignment signals BL_A. Bit line alignment circuits 905 is not necessary for embodiments of bit line decoder 809 in which each controlled bit line pair C_BL_P[X] always comprises the same controlled bit lines. Similarly, bit line alignment circuits 915 is not necessary for embodiments of bit line voltage selector 811 in which each voltage select bit line pair VS_BL_P[X] always comprises the same voltage select bit lines.

Bit-wise program/erase controller 810 controls controlled bit line pairs C_BL_P[N-1:0] by grounding selected controlled bit line pairs C_BL_P[N-1:0] or coupling selected controlled bit line pairs C_BL_P[N-1:0] to corresponding voltage select bit line pairs VS_BL_P[N-1:0]. Specifically, during read or idle cycles, i.e. when program signal P is not at the active logic level and erase signal E is not at active logic level, bit line inhibitor circuit 910 couples each controlled bit line pair C_BL_P[X] to the corresponding voltage select bit line pairs VS_BL_P[X].

During program cycles, i.e. when program signal P is at the program logic level, bit line inhibitor circuit 910 couples each controlled bit line pair C_BL_P[X] to the corresponding voltage select bit line pairs VS_BL_P[X] if the corresponding program bit signal P_B[X] is at the active logic level. However, if program bit signal P_B[X] is not at the active logic level during a program cycle, bit line inhibitor circuit 910 grounds the corresponding controlled bit line pair C_BL_P[X].

During erase cycles, i.e. when erase signal E is at the erase logic level, bit line inhibitor circuit 910 couples each controlled bit line pair C_BL_P[X] to the corresponding voltage select bit line pairs VS_BL_P[X] if the corresponding erase bit signal E_B[X] is at the active logic level. If erase bit signal E_B[X] is not at the active logic level during an erase cycle, bit line inhibitor circuit 910 grounds the corresponding controlled bit line pair C_BL_P[X]. TABLE 2 provides the logic table for bit line inhibitor circuit 910, in which the active logic level for erase bit signal E_B[X], program bit signal P_B[X], program signal P, and erase signal E is logic high.

TABLE 2

| P | E | P_B[X] | E_B[X] | State of C_BL_P[X] |
|---|---|--------|--------|---------------------|
| 0 | 0 | 0 | 0 | coupled to VS_BL_P[X] |
| 0 | 0 | 0 | 1 | coupled to VS_BL_P[X] |
| 0 | 0 | 1 | 0 | coupled to VS_BL_P[X] |
| 0 | 0 | 1 | 1 | coupled to VS_BL_P[X] |
| 0 | 1 | 0 | 0 | GROUNDED |
| 0 | 1 | 0 | 1 | coupled to VS_BL_P[X] |
| 0 | 1 | 1 | 0 | GROUNDED |
| 0 | 1 | 1 | 1 | coupled to VS_BL_P[X] |
| 1 | 0 | 0 | 0 | GROUNDED |
| 1 | 0 | 0 | 1 | coupled to VS_BL_P[X] |
| 1 | 0 | 1 | 0 | GROUNDED |
| 1 | 0 | 1 | 1 | coupled to VS_BL_P[X] |
| 1 | 1 | 0 | 0 | (Should not occur) |
| 1 | 1 | 0 | 1 | (Should not occur) |
| 1 | 1 | 1 | 0 | (Should not occur) |
| 1 | 1 | 1 | 1 | (Should not occur) |

Because comparator circuit 812 performs the same logic function for N different data bits, many embodiments of comparator circuit 812 use N identical bit comparator circuits to implement comparator circuit 812.

Figure 11:
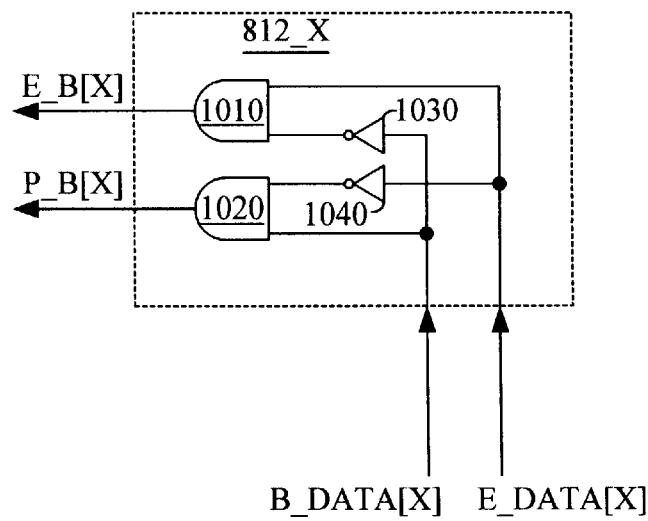
FIG. 11 is a schematic diagram of bit comparator circuit in accordance with one embodiment of the present invention.

FIG. 11 shows a schematic diagram of a bit comparator circuit 812_X in accordance with one embodiment of the present invention. Bit comparator circuit 812_X comprises an AND gate 1010, an AND gate 1020, an inverter 1030, and an inverter 1040. AND gate 1010 has an output terminal driving erase bit signal E_B[X], a first input terminal coupled to external data signal E_DATA[X], and a second input terminal coupled to an output terminal of inverter 1030, which has an input terminal coupled to buffer data signal B_DATA[X]. AND gate 1020 has an output terminal driving program bit signal P_B[X], a first input terminal coupled to buffer data signal B_DATA[X], and a second input terminal coupled to an output terminal of inverter 1040, which has an input terminal coupled to external data signal E_DATA[X]. Bit comparator 812_X performs the logic function given above in TABLE 1.

Because bit line inhibitor circuit 910 performs the same logic function for N different bit line pairs, many embodiments of bit line inhibitor circuit 910 use N identical single bit line pair inhibitor circuits to implement bit line inhibitor circuit 910.

Figure 12:
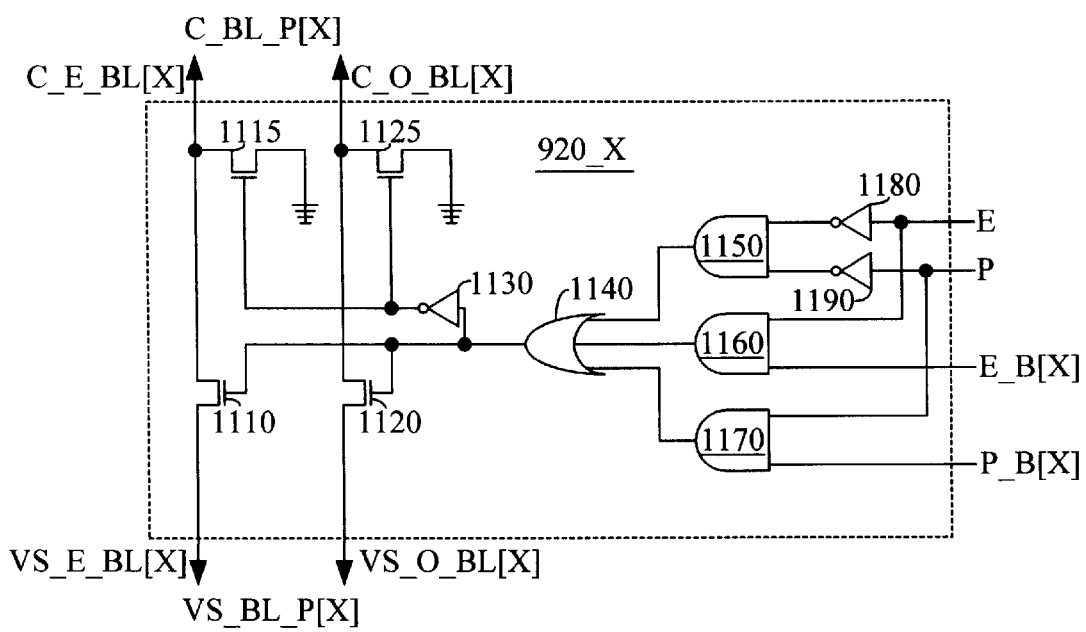
FIG. 12 is a schematic diagram of a bit line pair inhibitor circuit in accordance with one embodiment of the present invention.

FIG. 12 shows a schematic diagram of a single bit line pair inhibitor circuit 910_X in accordance with one embodiment of the present invention. Single bit line pair inhibitor circuit 910_X comprises a pass transistor 1110, a bypass transistor 1115, a pass transistor 1120, a bypass transistor 1125, an inverter 1130, an OR gate 1140, AND gates 1150, 1160, and 1170, and inverters 1180 and 1190.

Pass transistor 1110 is coupled between a voltage select even bit line VS_E_BL[X] of voltage select bit line pair VS_BL_P[X] and a controlled even bit line C_E_BL[X] of controlled bit line pair C_BL_P[X]. The control terminal of pass transistor 1110 is coupled to the output terminal of OR gate 1140. If OR gate 1140 drives a logic high to the control terminal of pass transistor 1110, pass transistor 1110 turns on, i.e. becomes conductive. If OR gate 1140 drives a logic low to the control terminal of pass transistor 1110, pass transistor 1110 turns off, i.e. becomes non conductive. Bypass transistor 1115 is coupled between controlled even bit line C_E_BL[X] and ground. The control terminal of bypass transistor 1115 is coupled to the output terminal of inverter 1130, which has an input terminal coupled to the output terminal of OR gate 1140. Therefore, bypass transistor 1115 is turned on when pass transistor 1110 is turned off. Conversely, bypass transistor 1115 is turned off when pass transistor 1110 is turned on. Thus, depending on the output of OR gate 1140, controlled even bit line C_E_BL[X] is either coupled to voltage select even bit line VS_E_BL[X] or grounded.

Similarly, pass transistor 1120 is coupled between a voltage select odd bit line VS_O_BL[X] of voltage select bit line pair VS_BL_P[X] and controlled odd bit line C_O_BL[X] of controlled bit line pair C_BL_P[X]. The control terminals of pass transistor 11120 is coupled to the output terminal of OR gate 1140. Bypass transistor 1125 is coupled between controlled odd bit line C_O_BL[X] and ground. The control terminal of bypass transistor 1125 is coupled to the output terminal of inverter 1130, which has an input terminal coupled to the output terminal of OR gate 1140. Pass transistors 1120 and bypass transistor and 1125 operate in the same manner as pass transistor 1110 and bypass transistor 1115, respectively; therefore, the operational description is not repeated.

The output terminal of OR gate 1140 is driven high under three conditions: a read cycle, an erase cycle when erase bit signal E_B[X] is at logic high, and a program cycle when program bit signal P_B[X] is at logic high. OR gate 1140 has three input terminals, each coupled to an output terminal of AND gate 1150, AND gate 1160, and AND gate 1170, respectively.

AND gate 1150 detects a read cycle since the first input terminal of 1150 is coupled to erase signal E through an inverter 1180 and the second input terminal of AND gate 1150 is coupled to program signal P through inverter 1190. Thus, AND gate 1150 outputs a logic high signal only if memory control circuit is not performing an erase cycle nor a program cycle. AND gate 1160 has a first input terminal coupled to erase signal E and a second input terminal coupled to erase bit signal E_B[X]. Thus, AND gate 1160 outputs a logic high signal only if an erase cycle is occurring, as indicated by a logic high level on erase signal E and if erase bit signal E_B[X] is at logic high. Conversely, AND gate 1170 has a first input terminal coupled to program signal P and a second input terminal coupled to program bit signal P_B[X]. Thus, AND gate 1170 outputs a logic high signal only if a program cycle is occurring, as indicated by a logic high level on program signal P and if program bit signal P_B[X] is at logic high.

Figure 13:
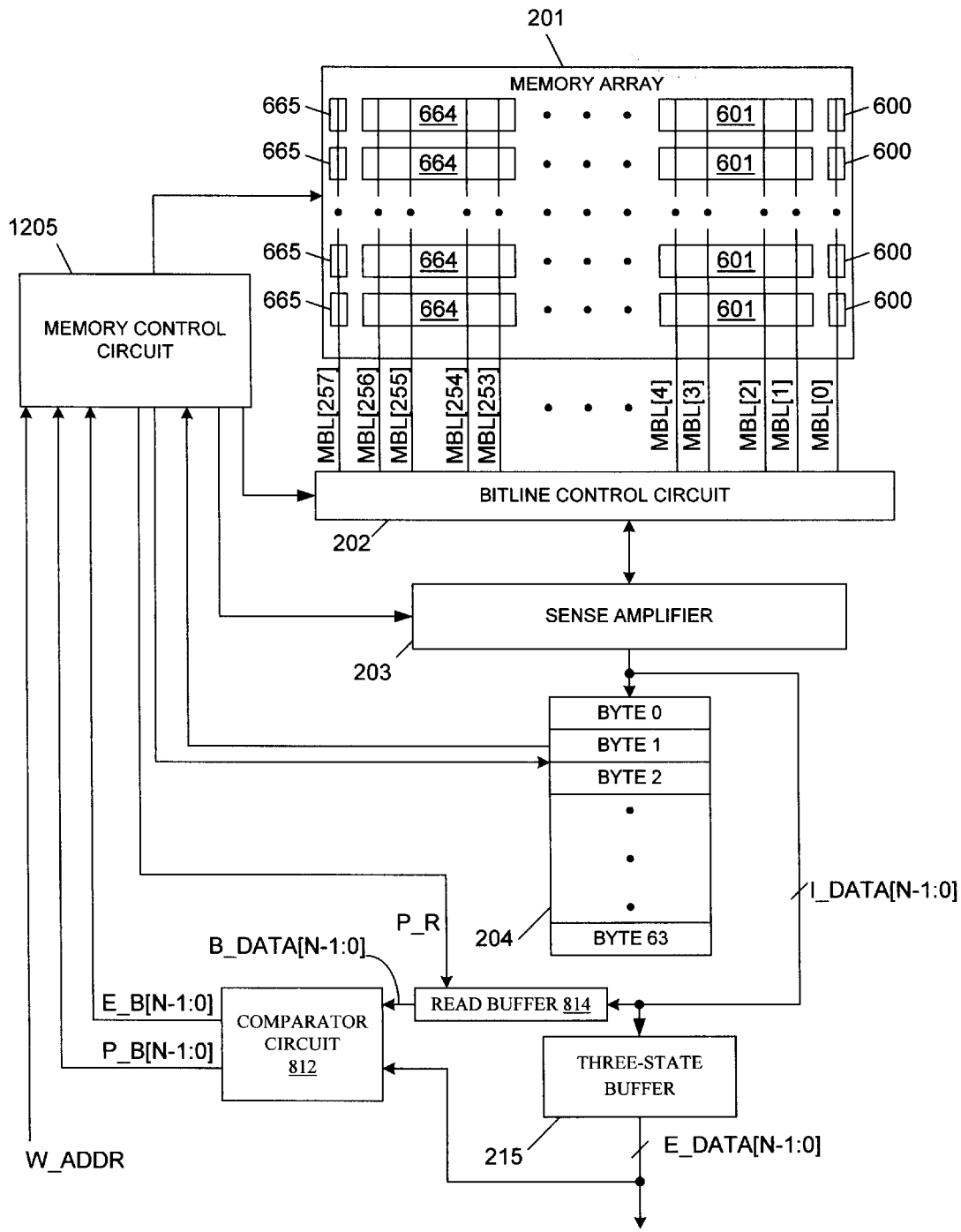
FIG. 13 is a block diagram of the memory circuit of FIG. 6 using a bit-wise program/erase controller in accordance with one embodiment of the present invention.

FIG. 13 shows how comparator circuit 812 and read buffer 814 can be used with erase emulation structure 200. Memory control circuit 205 is replaced by a memory control circuit 1205. Comparator circuit 812 is inserted between memory control circuit 1205 and external data signals E_DATA[N-1:0]. Memory control circuit 205 is replaced by a memory control circuit 1205. Memory array 201, bit line control circuit 202, sense amplifier 203, storage device 204, and bi-directional three state buffer 215 do not need to be modified to function with comparator circuit 812.

As explained above, when external data is to be written into memory array 201, emulation structure 200 (FIG. 6) reads 64 data words into storage device 204. Then all the memory cells which were read as well as the data word at write address W_ADDR are erased. However, with comparator circuit 812 only a subset of the bits of the 64 data words are actually erased or programmed.

Specifically, memory control circuit 1205 performs a program read operation of the data word at write address W_ADDR, which will be placed on internal data signals I_DATA[7:0] for read buffer 814. Memory control circuit 1205 drives an active edge on program read signal P_R to cause read buffer 814 to store the current data word at write address W_ADDR. Comparator circuit 812 generates erase bit signals E_B[N-1:0] and program bit signals P_B[N-1:0] as described above.

Memory circuit 1205 then performs the 64 sequential reads in the same manner as memory control circuit 205 as described above. Memory control circuit 1205 performs an erase operation using write address W_ADDR by controlling bit line control circuit 202 to drive erase voltages only on bit lines corresponding to memory cells which correspond to erase bit signals E_B[N-1:0], which are at the active logic level. Thus, only memory cells corresponding to an erase bit signal E_B[X], which is at the active logic level are erased. Thus, only a subset of the memory cells of the 64 data words are actually erased.

Memory control circuit 1205 then performs a program operation at write address W_ADDR by controlling bit line control circuit 202 to drive program voltages on bit lines corresponding to memory cells which correspond to program bit signals P_B[N-1:0], which are at the active logic level. Thus, only memory cells corresponding to a program bit signal P_B[X], which is at the active logic level are programmed. Thus, only a subset of the memory cells at write address W_ADDR is programmed. However, during the 63 program cycles to restore the contents of storage device 204 into memory array 201, memory control circuit 1205 should use the values corresponding to the erased bits of memory array 201 from storage device 204 to reprogram memory array 201. For example, if only bits 7 and 5 were erased in the erase operation, memory control circuit 1205 should only attempt to program bits 7 and 5 during the program operations to restore the data in storage device 204 into memory array 201. Thus, by incorporating comparator circuit 812 into emulator structure 200, only a subset of the memory cells are required to be erased and programmed during a write operation. Decreasing the number of times a memory cell is programmed and erased increases the endurance of the memory cells in memory array 201.

Although the invention has been described in connection with several embodiments, it is understood that this invention is not limited to the embodiments disclosed, but is capable of various modifications which would be apparent to a person skilled in the art. For example, although the memory blocks have been described as having eight diffusion bit lines, four metal bit lines and eight select transistors, it is understood that memory blocks having different numbers of diffusion bit lines, metal bit lines and select transistors can be constructed. Moreover, although memory blocks 100 and 300 have been described as having 32 rows of memory cells and one row of memory cells, respectively, it is understood that other numbers of memory cell rows can be used in other embodiments. In addition, although the charge trapping regions have been described in connection with an ONO structure, it is understood that these charge trapping regions can be implemented by other layers, such as a layer of silicon oxide having buried polysilicon islands. Moreover, elements other than the described select transistors can be used to provide access to the memory cells. Thus, the invention is limited only by the following claims.

What is claimed is:

1. A method for writing a new data word having plurality of new bits at a write address of a memory array having a plurality of memory cells at the write address, the method comprising the steps of:
    reading a current data word having a plurality of current data bits from the memory array at the write address;
    comparing the current data word with the new data word; and
    writing a first subset of the new bits into the memory array, wherein said first subset of new bits is smaller than said plurality of new bits.

2. The method of claim 1, wherein the step of writing a first subset of new bits into the memory array, comprises the steps of:
    erasing a first subset of memory cells at the write address; and
    programming a second subset of memory cells at the write address, wherein the first subset of memory cells and the second subset of memory cells is smaller than the plurality of memory cells.

3. The method of claim 2, wherein each new bit of the plurality of new bits corresponds to one current bit of the plurality of current bits and one memory cell of the plurality of memory cells and wherein each memory cell at a programmed state with a corresponding new bit at an erased logic level is in the first subset of memory cells.

4. The method of claim 3, wherein the erased logic level is logic high.

5. The method of claim 3, wherein each memory cell at an erased state with a corresponding new bit at a programmed logic level is in the second subset of memory cells.

6. The method of claim 5, wherein the programmed logic level is logic low.

7. The method of claim 1, wherein the step of comparing the current data word with the new data word comprises the step of comparing each of the new bits with a corresponding one of the current bits.

8. The method of claim 2, further comprising the steps of:
    generating a plurality of erase bit signals, wherein each memory cells corresponding to an erase bit at an active logic level is in the first subset of memory cells; and
    generating a plurality of program bit signals, wherein each memory cells corresponding to a program bit at the active logic level is in the second subset of memory cells.

9. The method of claim 2, wherein each of said memory cells is a non volatile memory cell.

10. The memory circuit of claim 1, wherein each of said memory cells is a non-volatile memory cell.

11. A memory circuit comprising:
    a memory array, wherein a memory address of the memory array addresses a data word having a plurality of memory cells;
    a bit-wise program/erase controller coupled to the memory array;
    a bit line voltage selector coupled to the bit-wise program/erase controller; and
    wherein the bit line voltage selector is coupled to the bit-wise program/erase controller by a plurality of voltage select bit line pairs, and wherein the bit-wise program/erase controller is configured to couple a first subset of the voltage select bit line pairs to the memory array during a program cycle and to couple a second subset of the voltage select bit line pairs to the memory array during an erase cycle.

12. The memory circuit of claim 11, wherein the bit-wise program/erase controller is configured to erase a first subset of the memory cells and to program a second subset of the memory cell.

13. The memory circuit of claim 11, further comprising a bit line control circuit coupled between the memory array and the bit-wise program/erase controller.

14. The memory circuit of claim 11, wherein the bit-wise program/erase controller comprises:
    a bit line inhibitor circuit;
    a comparator circuit coupled to the bit line inhibitor circuit; and a read buffer coupled to the comparator circuit.

15. The memory circuit of claim 14, wherein the comparator circuit is configured to compare an external data word and an internal data word.

16. The memory circuit of claim 15, wherein the internal data word is from the memory cells of the memory array at a write address, and the external data word is to be written into the memory array at the write address.

17. The memory circuit of claim 14, wherein the comparator circuit is configured to generate a plurality of erase bit signals and a plurality of program bit signals.

18. The memory circuit of claim 14, wherein the comparator circuit comprises a plurality of bit comparator circuits.

19. The memory circuit of claim 14, wherein the bit line inhibitor circuit comprises a plurality of bit line pair inhibitor circuits.

20. A memory circuit comprising:
a memory array, wherein a memory address of the memory array addresses a data word having a plurality of memory cells;
a comparator circuit configured to compare a plurality of internal data signals from said memory array and a plurality of external data signals, wherein each internal data signal corresponds to one external data signal and to one memory cell at each of said memory address;
a memory controller coupled to said comparator and said memory array; and
wherein said comparator circuit is configured to compare each internal data signal with said corresponding external data signal and wherein said comparator circuit is configured to generate an erase bit signal and a program bit signal for each external data bit signal to form a plurality of erase bit signals and a plurality of program bit signals.

21. The memory circuit of claim 20, wherein said memory control circuit is configured to erase a first subset of memory cells, wherein said first subset of memory cells comprises every memory cell corresponding to an erase bit signal in an active state.

22. The memory circuit of claim 21, wherein said memory control circuit is configured to program a second subset of memory cells, wherein said second subset of memory cells comprises every memory cell corresponding to a program bit signal in said active state.

23. The memory circuit of claim 20, further comprising a bit line voltage selector coupled to said memory array by a plurality of bit lines, wherein said bit line voltage selector is configured by said memory controller to drive an erase voltage on a first subset of said plurality of bit lines.

24. The memory circuit of claim 23, wherein said bit line voltage selector is configured by said memory controller to drive a program voltage on a second subset of said plurality of bit lines.

25. The memory circuit of claim 20, wherein each of said memory cells is a non volatile memory cell.

* * * * *

UNITED STATES PATENT AND TRADEMARK OFFICE
CERTIFICATE OF CORRECTION

PATENT NO. : 6,157,570
DATED : Dec. 5, 2000
INVENTOR(S) : Ishai Nachumovsky

It is certified that error appears in the above-identified patent and that said Letters Patent is hereby corrected as shown below:

On the title page: Item
[56]    References Cited 6,011,725    1/2000  Eitan..........................................365/185.23

Col. 5, line 64 – Ser. No. 09/244,316

Col. 8, line 2 – issued

Col. 9, line 41 – U.S. Pat. No. 6,081,456

Signed and Sealed this

Fifteenth Day of May, 2001

NICHOLAS P. GODICI

*Attest:*

*Attesting Officer*    *Acting Director of the United States Patent and Trademark Office*